(12) United States Patent
Kobashi

(10) Patent No.: US 6,839,107 B2
(45) Date of Patent: Jan. 4, 2005

(54) ELECTRO-OPTICAL DEVICE HAVING IRREGULARITY-FORMING THIN FILM AND ELECTRONIC APPARATUS

(75) Inventor: Yutaka Kobashi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 302 days.

(21) Appl. No.: 10/131,469

(22) Filed: Apr. 25, 2002

(65) Prior Publication Data

US 2002/0158573 A1 Oct. 31, 2002

(30) Foreign Application Priority Data

Apr. 25, 2001 (JP) ........................................ 2001-128053

(51) Int. Cl.⁷ ...................... G02F 1/1333; G02F 1/136; H01L 29/04
(52) U.S. Cl. ........................ 349/113; 349/42; 349/138; 257/72
(58) Field of Search ............................. 349/42, 43, 113, 349/138; 257/59, 72

(56) References Cited

U.S. PATENT DOCUMENTS

| 6,172,728 B1 | * | 1/2001 | Hiraishi ..................... 349/139 |
| 6,208,395 B1 | | 3/2001 | Kanoh et al. ................ 349/113 |
| 6,262,783 B1 | * | 7/2001 | Tsuda et al. ................... 349/39 |
| 6,341,002 B1 | * | 1/2002 | Shimizu et al. ............. 349/119 |
| 6,490,019 B2 | * | 12/2002 | Lee et al. .................... 349/113 |
| 6,556,260 B1 | * | 4/2003 | Itou et al. ..................... 349/69 |
| 2002/0118326 A1 | * | 8/2002 | Sakamoto et al. ........... 349/113 |

FOREIGN PATENT DOCUMENTS

JP 09-54318 2/1997

* cited by examiner

Primary Examiner—Tarifur R. Chowdhury
(74) Attorney, Agent, or Firm—Oliff & Berridge, PLC

(57) ABSTRACT

The invention provides an electro-optical device provided including a light reflector having a light diffusion function in a preferable condition while an increase in manufacturing cost thereof is minimized, and also provides an electronic apparatus using the same. The present invention can include an active matrix type reflective or transflective electro-optical device wherein, on a surface of a light reflector of an array substrate, irregularity-forming thin-films can be formed by patterning thin-films composed of the same layers as those forming a underlying protection film, a gate insulation film, a scanning line, a first interlayer insulation film, a data line, and a second interlayer insulation film so as to have predetermined patterns. Since an irregular pattern is formed by steps and irregularity of the irregularity-forming thin-films mentioned above, incident light on an counter substrate can be reflected thereto while being diffused.

39 Claims, 19 Drawing Sheets

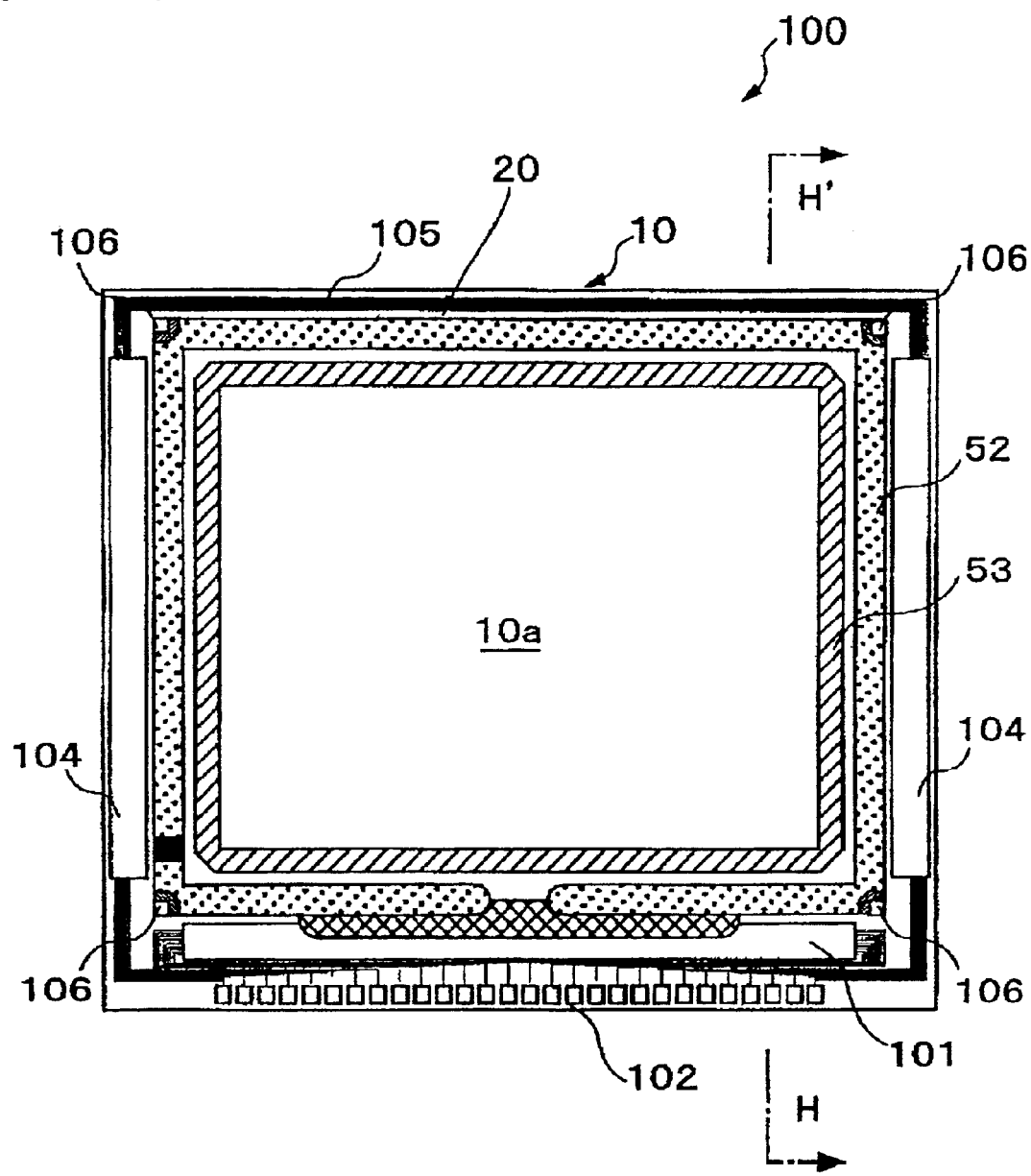
[FIG. 1]

(FIG. 2)
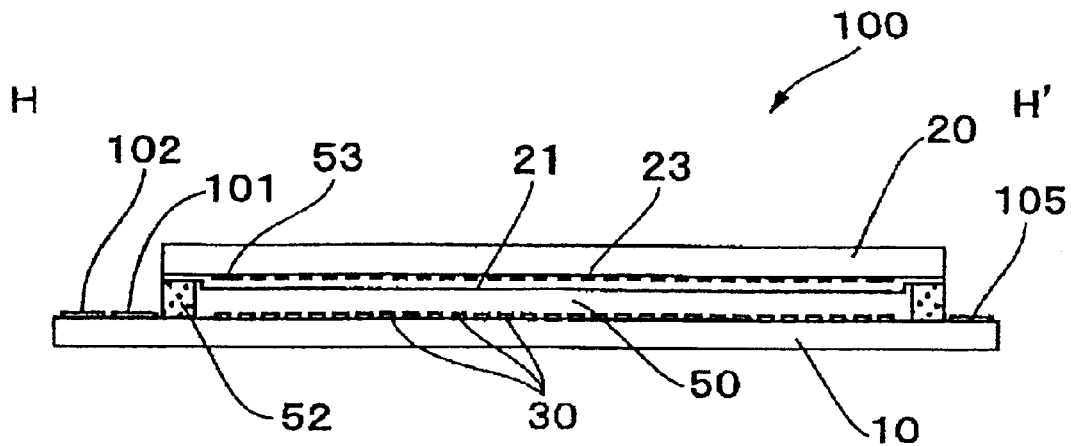
(FIG. 3)
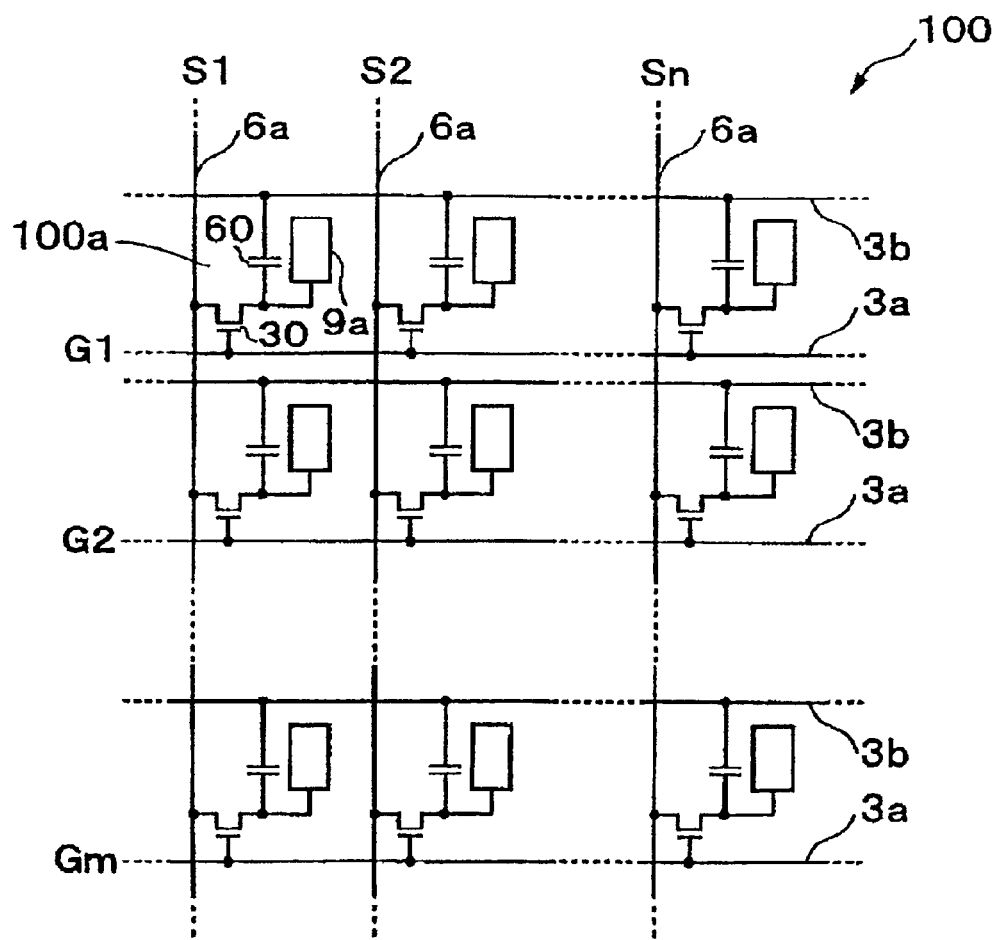

[FIG. 4]
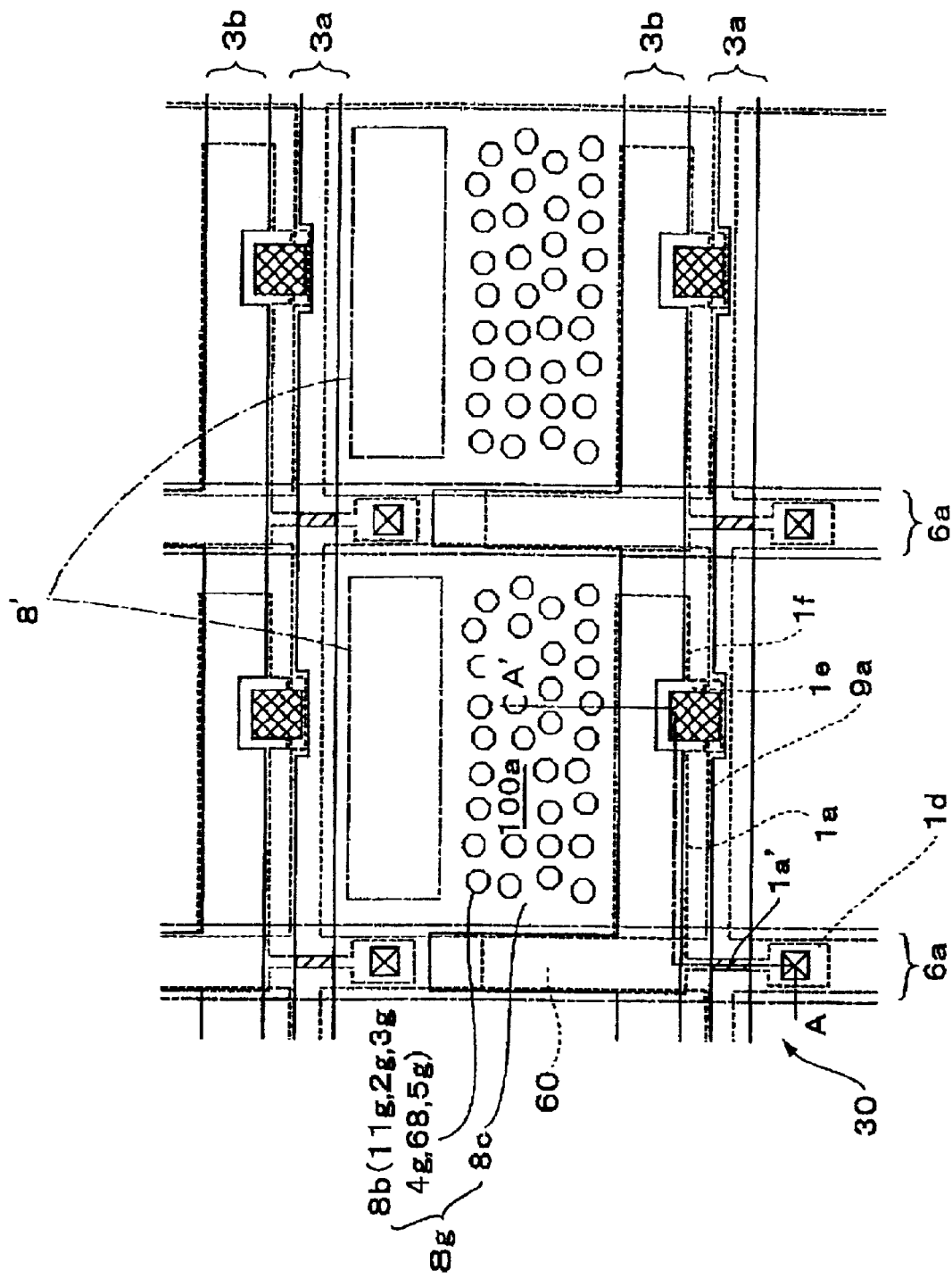

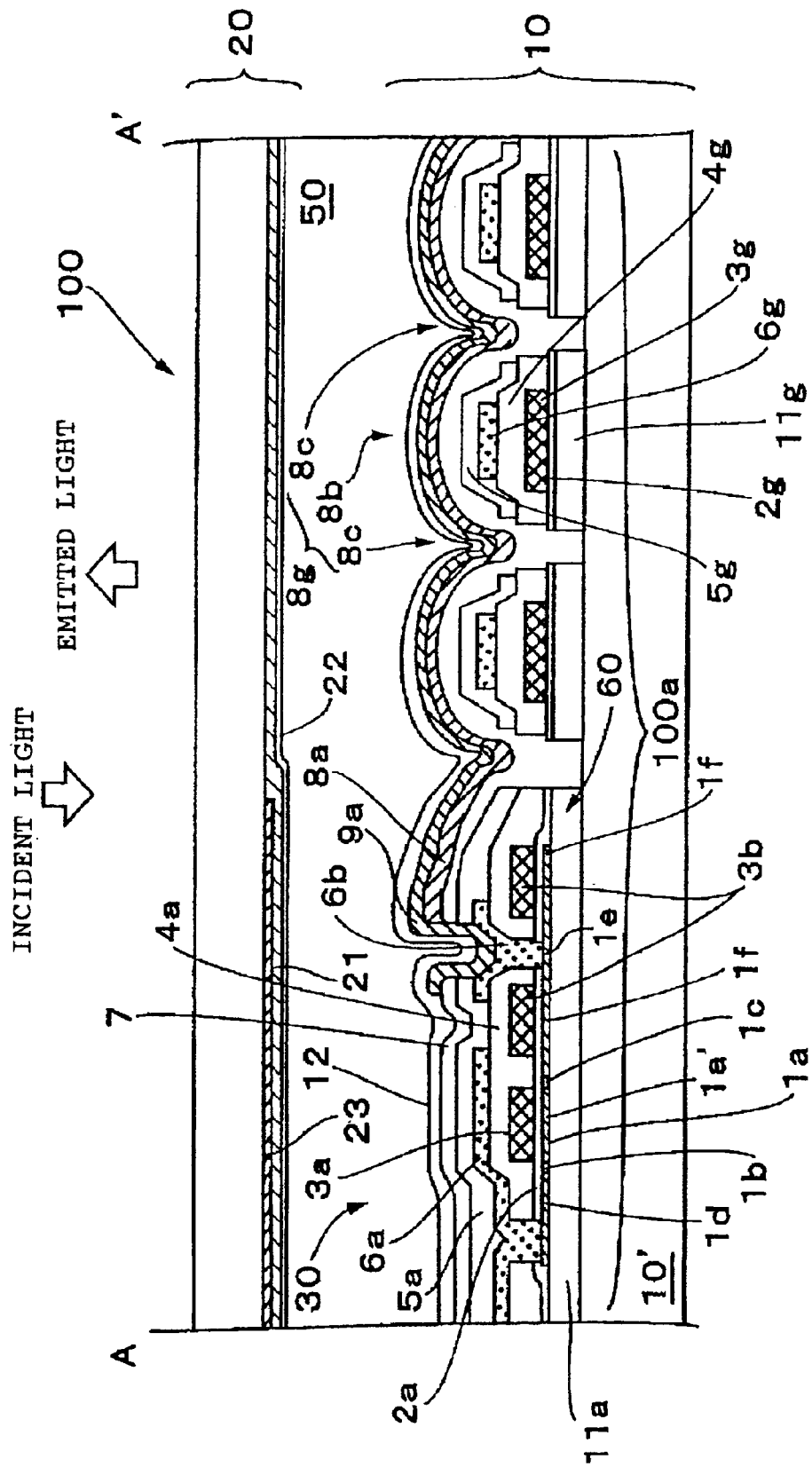
[FIG. 5]

[FIG. 6]
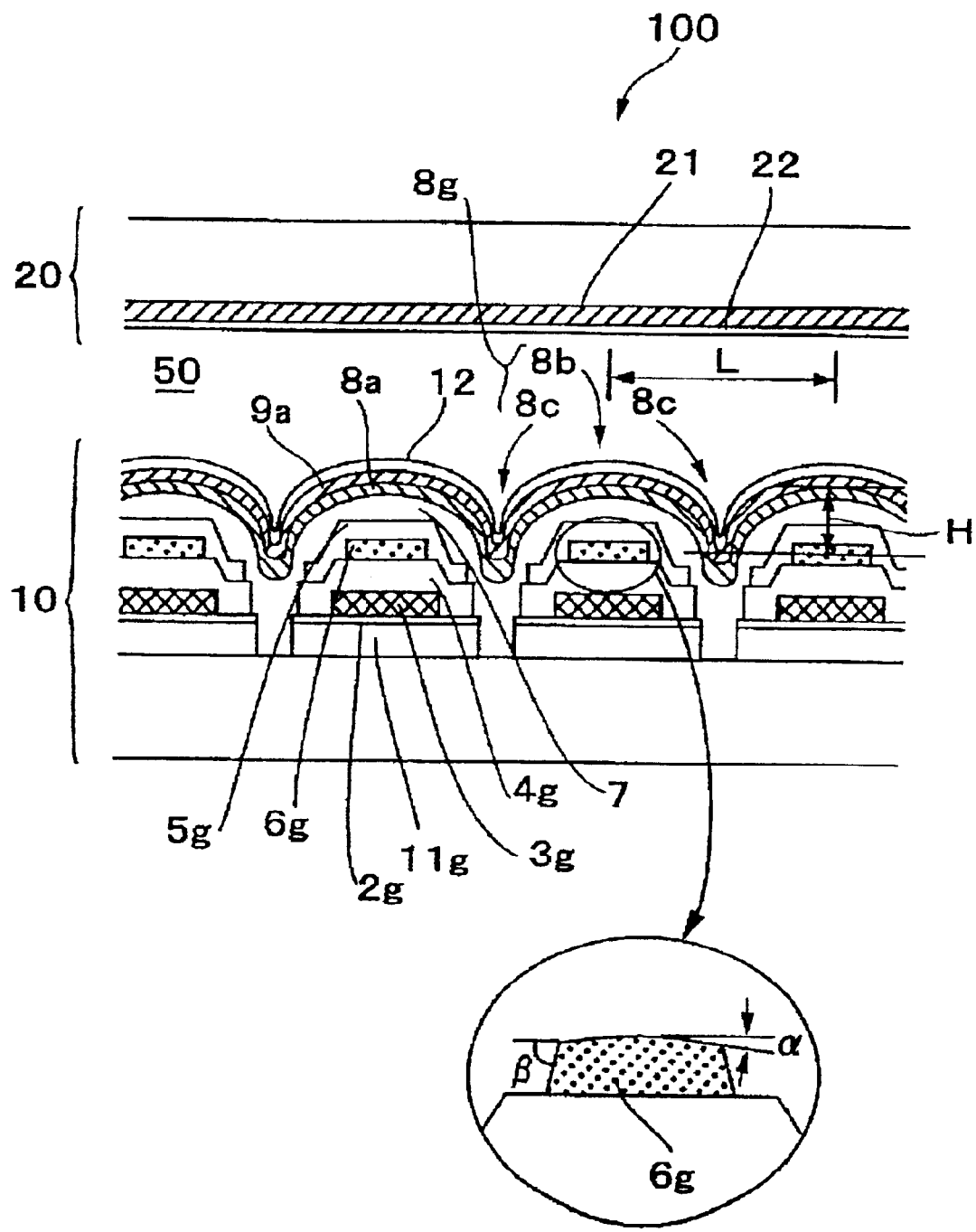

[FIG. 7]
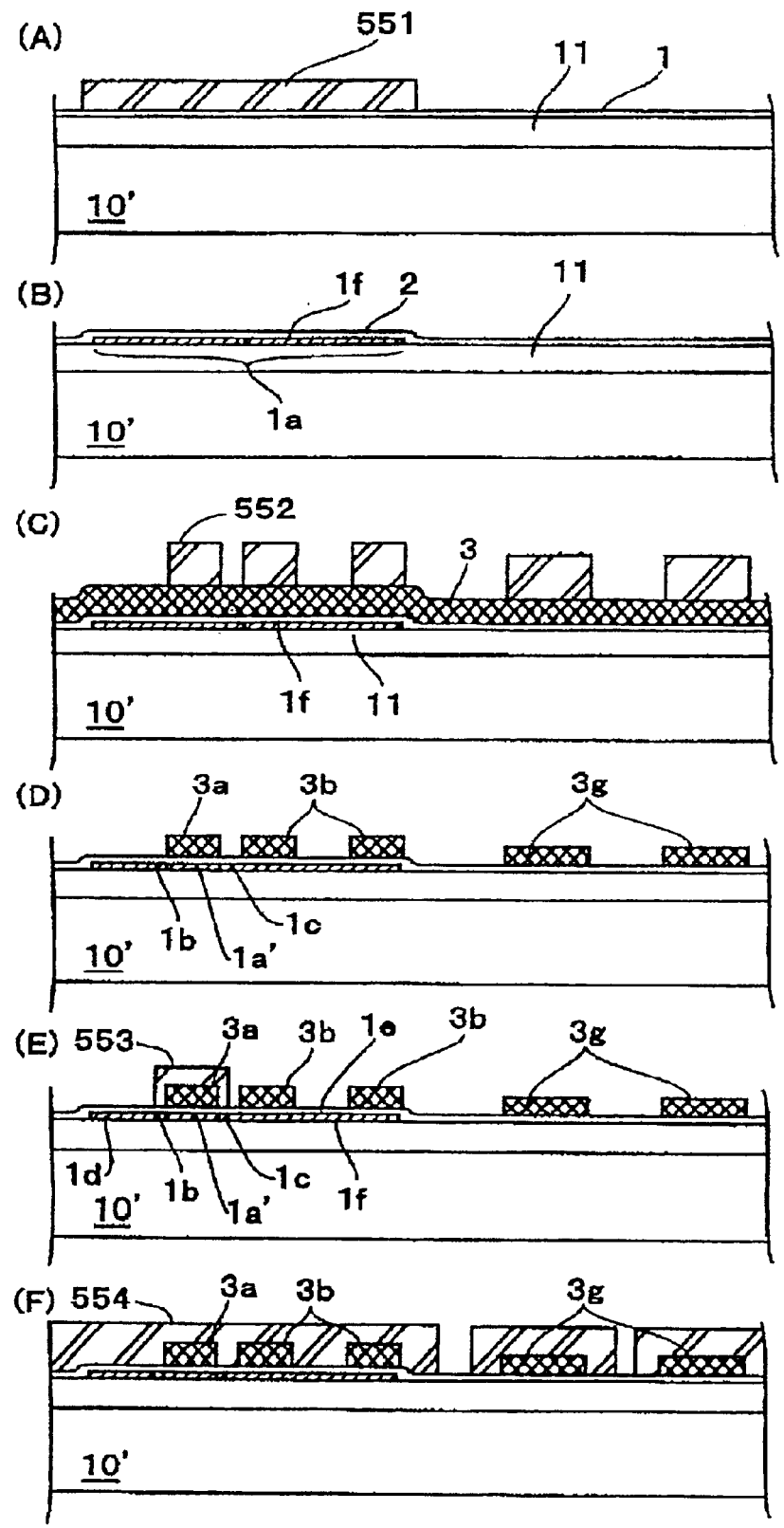

(FIG. 8)
(A)
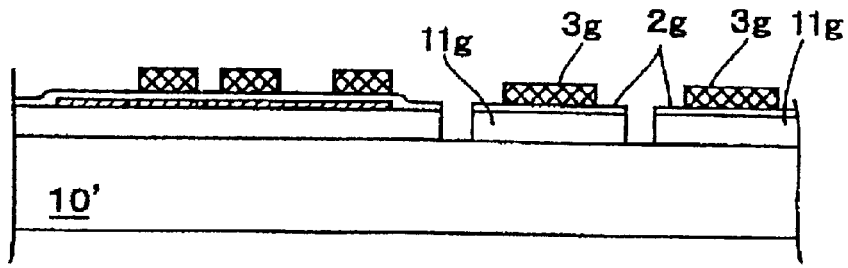
(B)
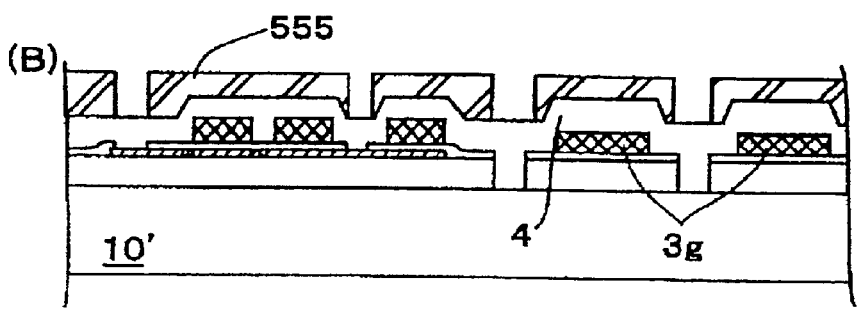
(C)
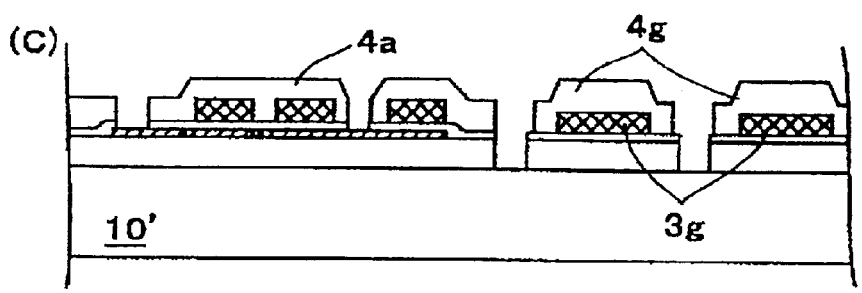
(D)
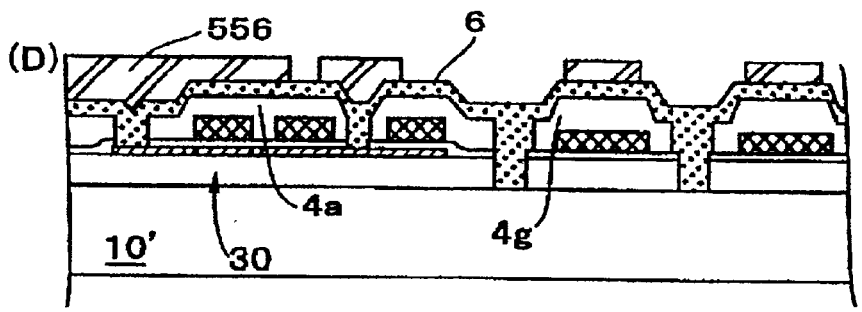
(E)
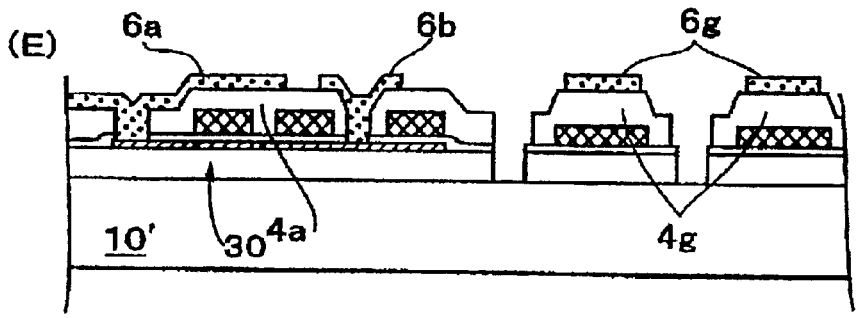

[FIG. 9]
(A)
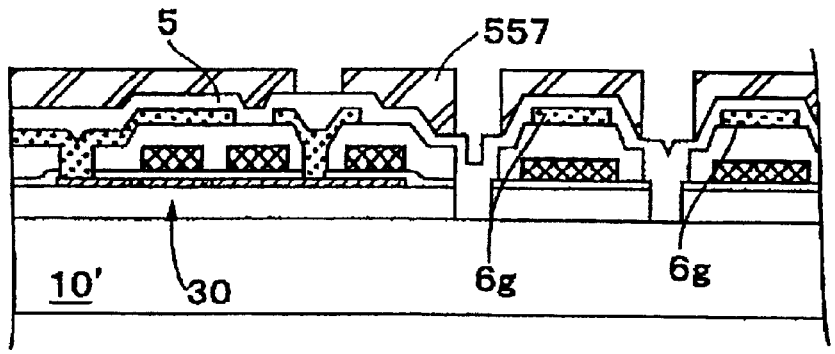
(B)
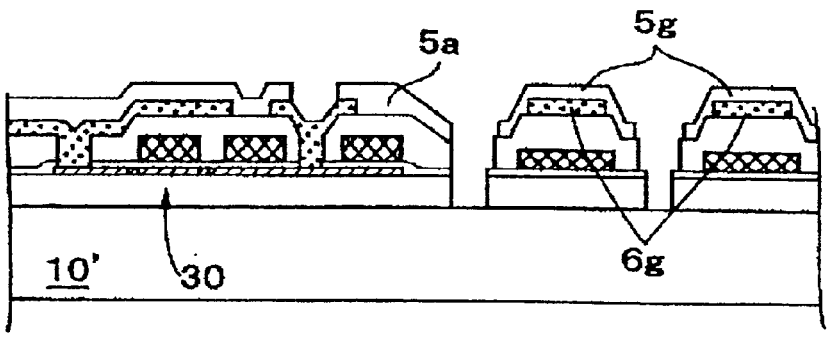
(C)
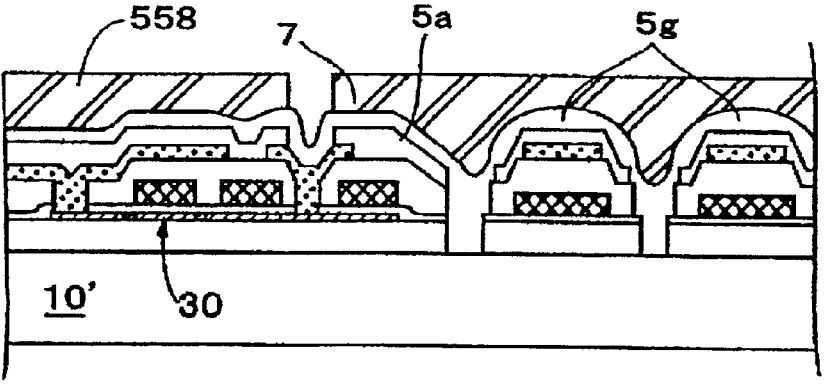
(D)
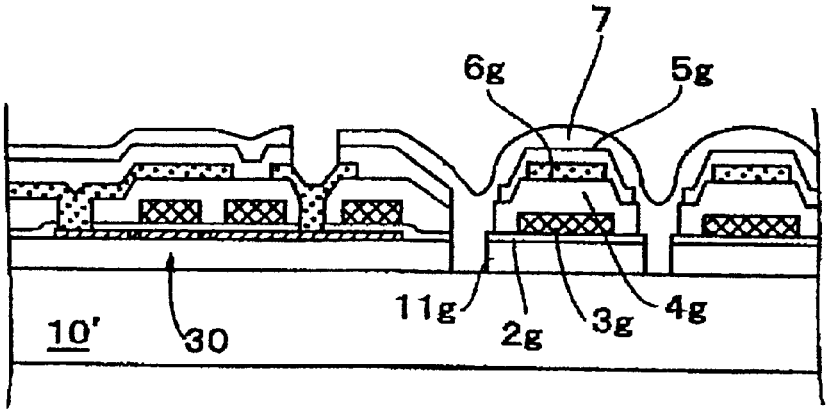

(FIG. 10)
(A)
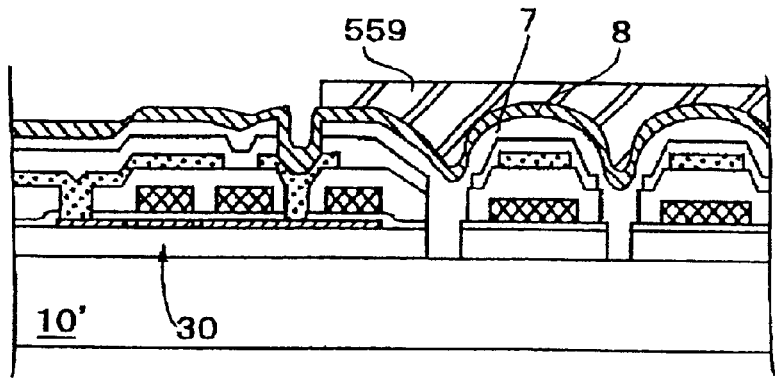
(B)
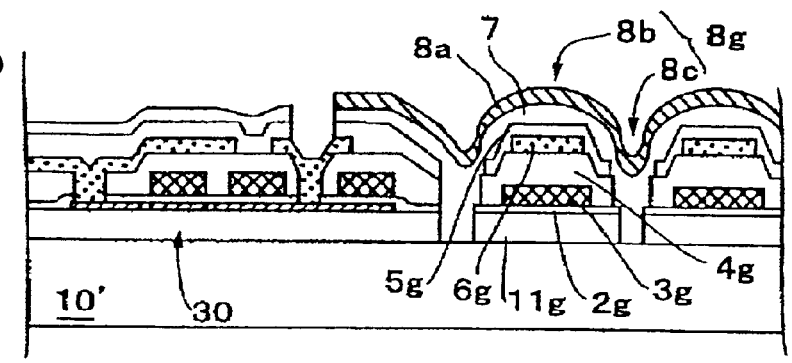
(C)
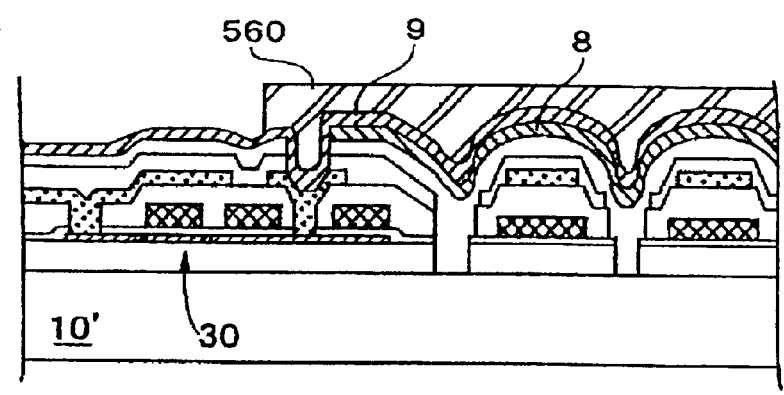
(D)
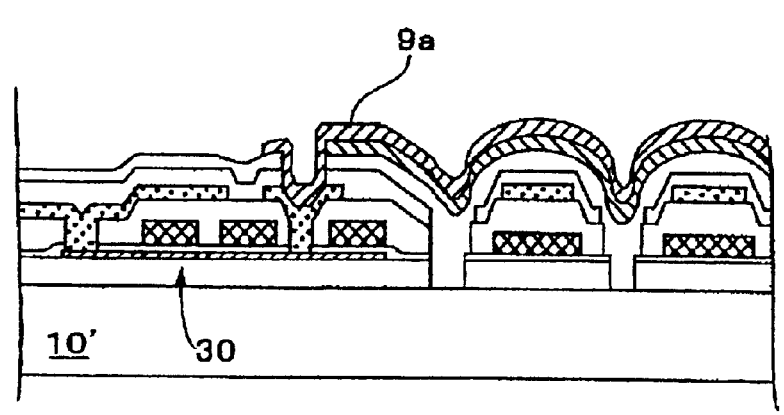

[FIG. 11]
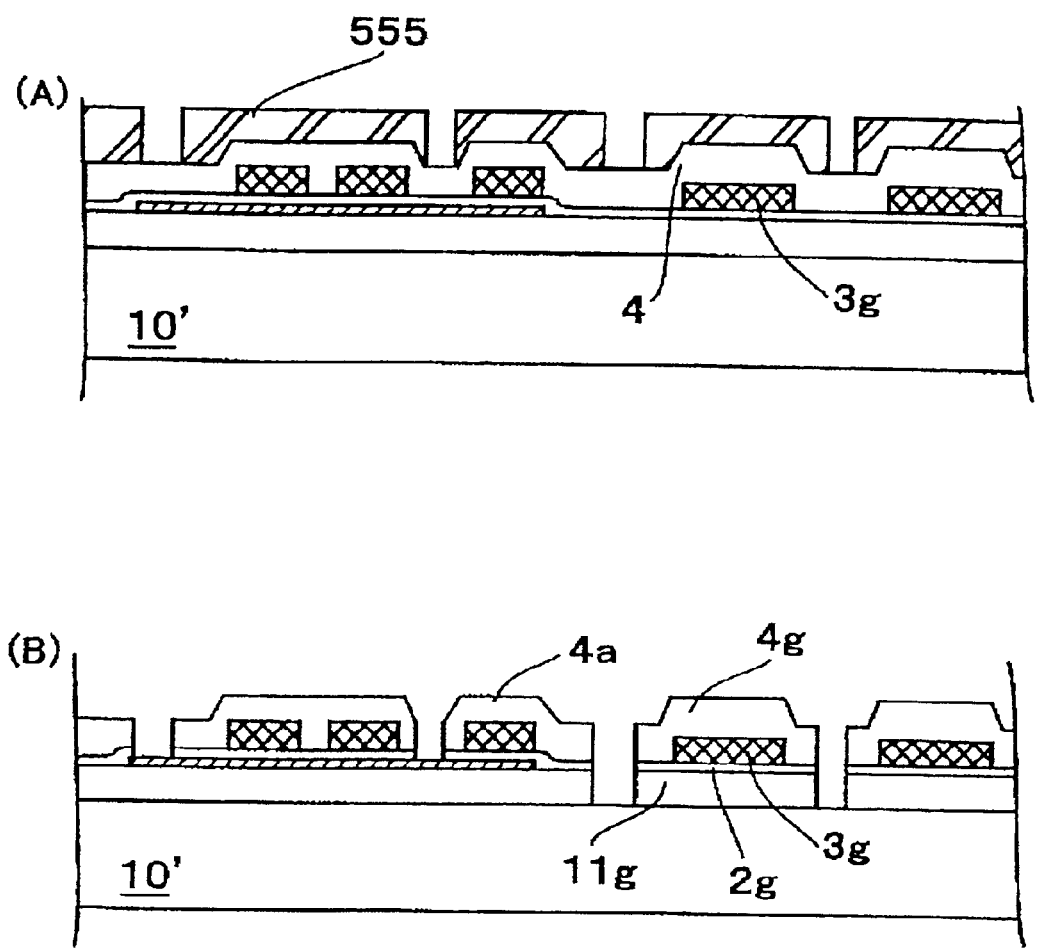

[FIG. 12]
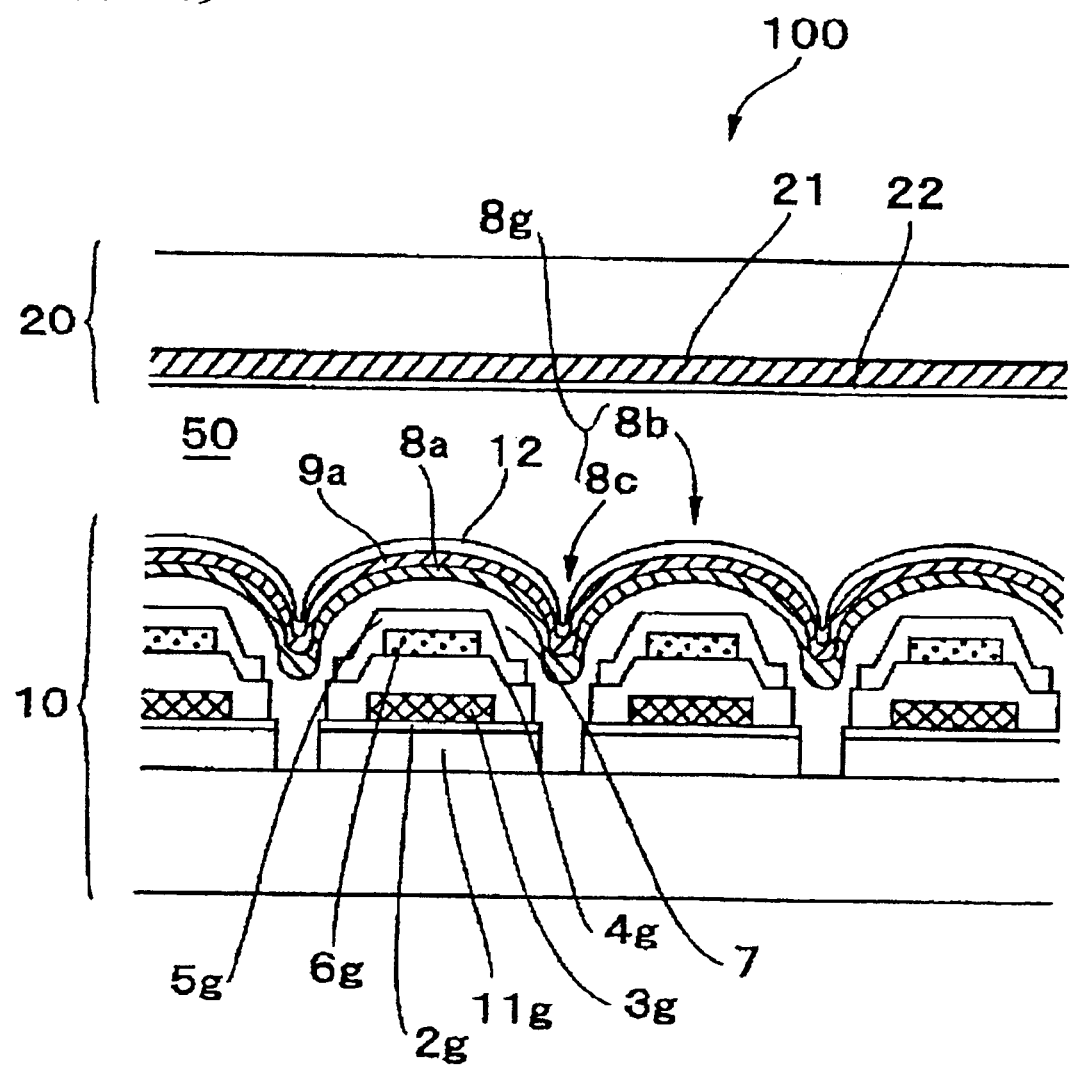

[FIG. 13]
(A)
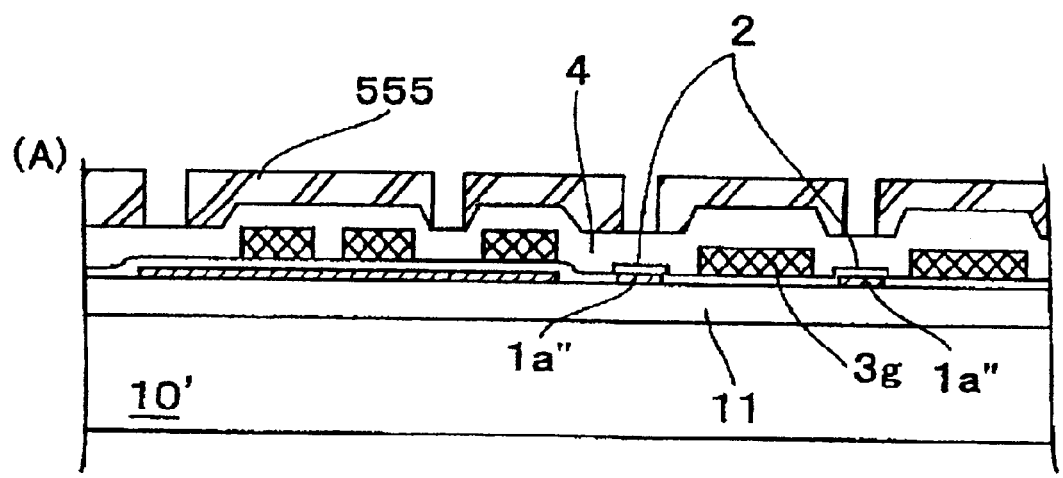
(B)
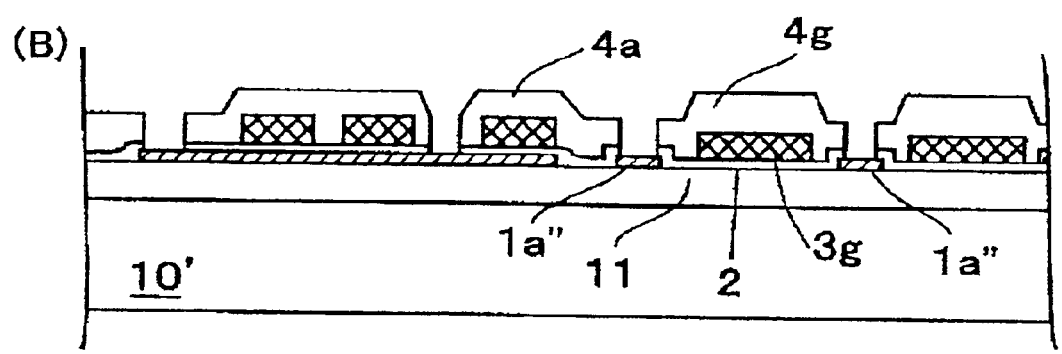

[FIG. 14]
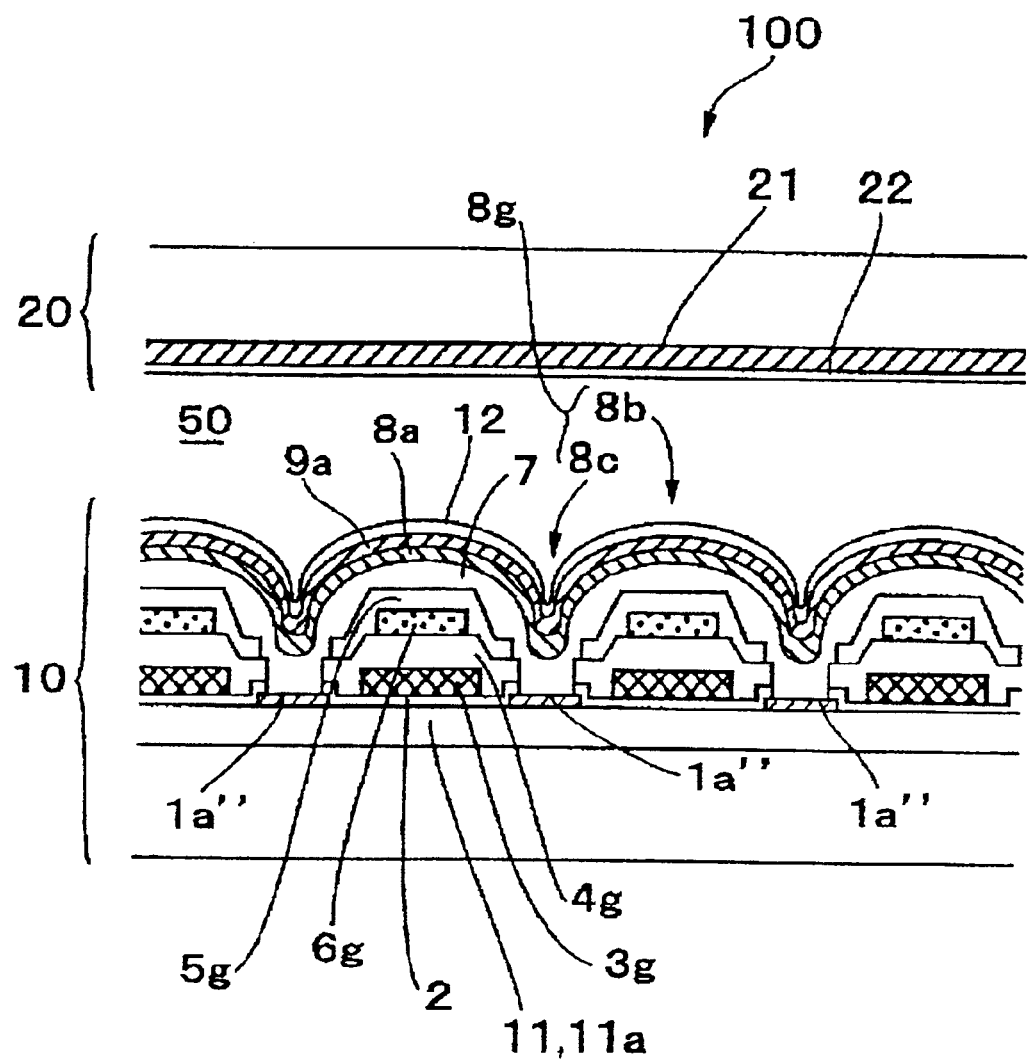

[FIG. 15]
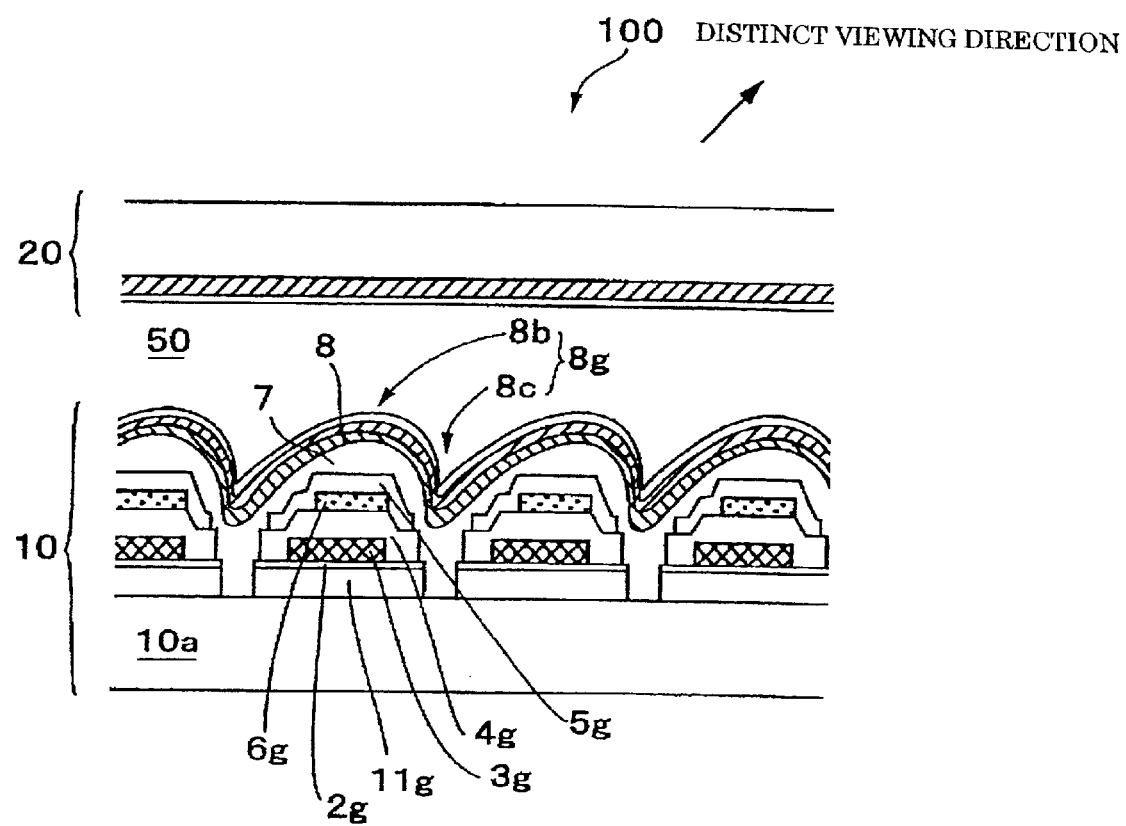

[FIG. 16]
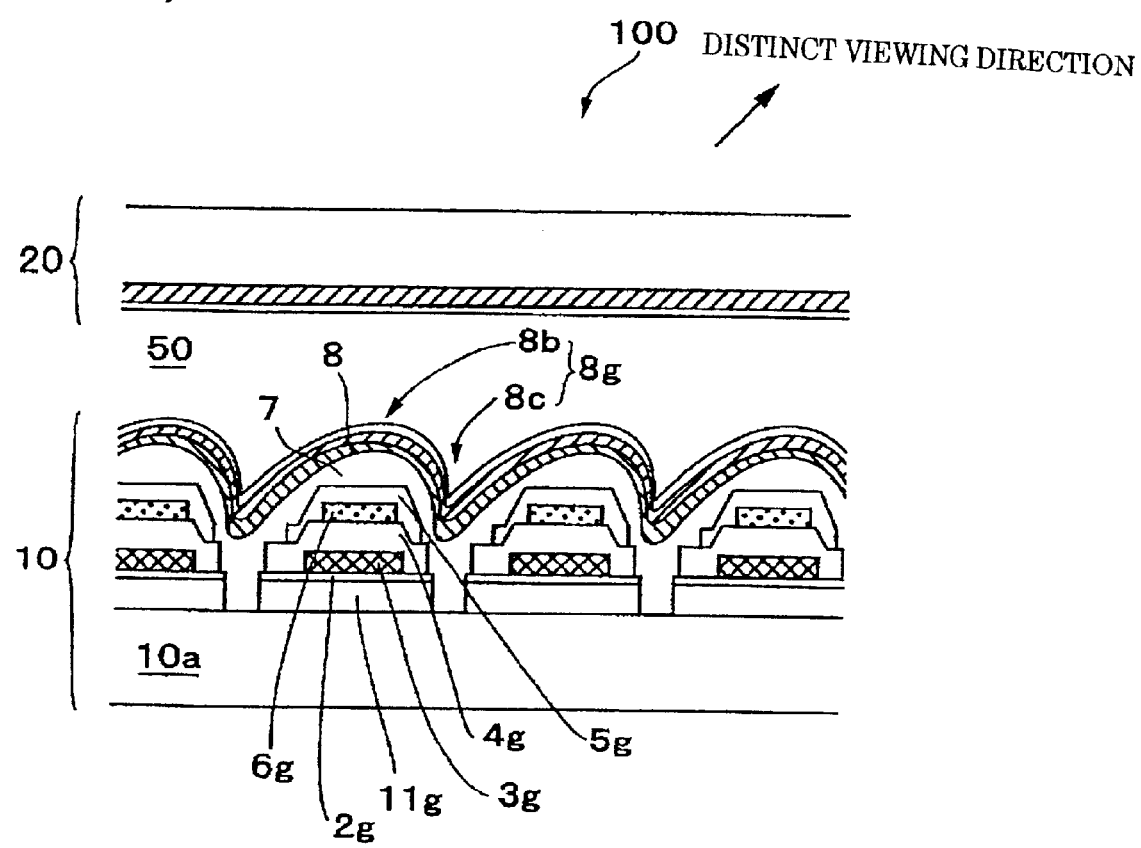

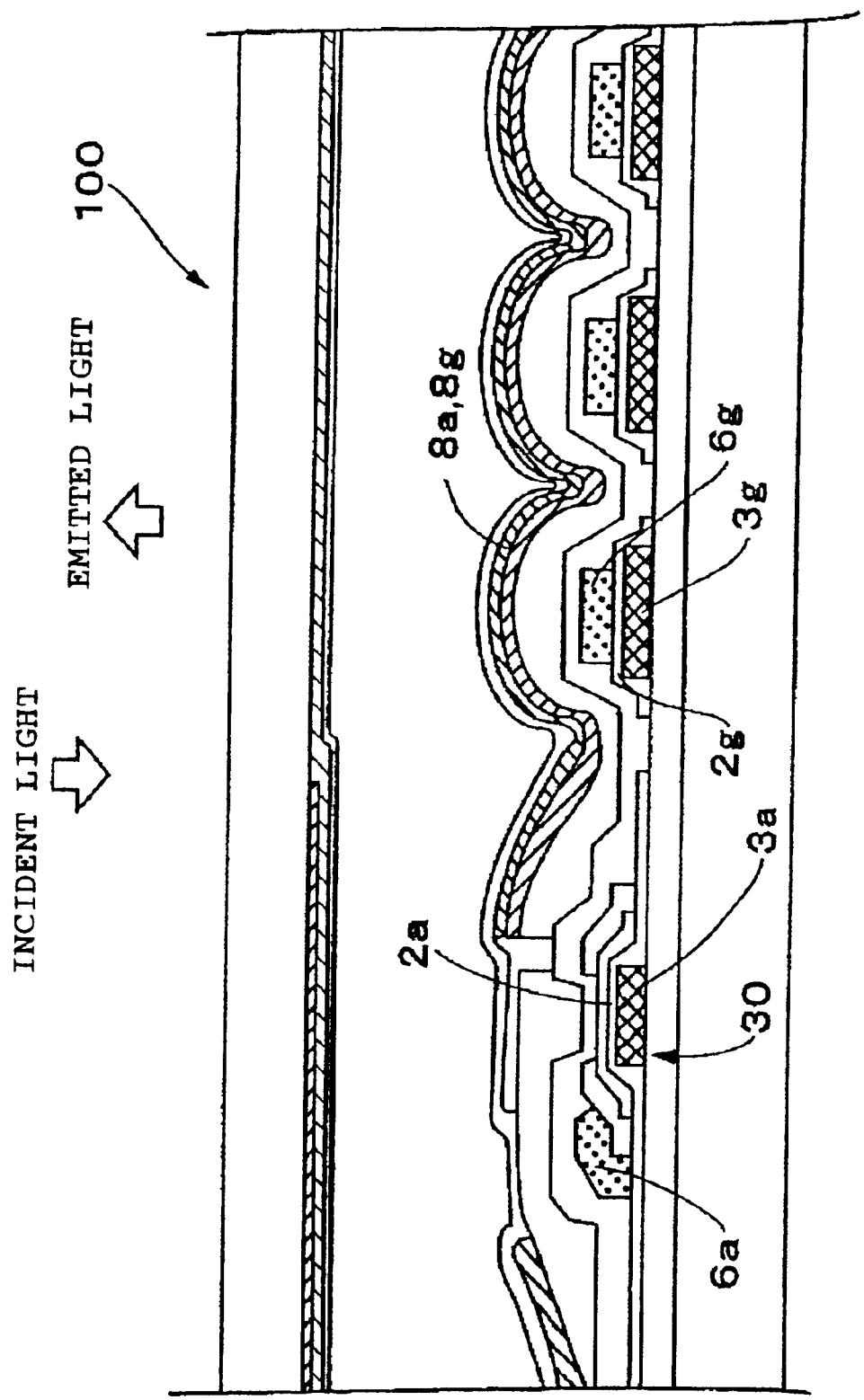
[FIG. 17]

[FIG. 18]
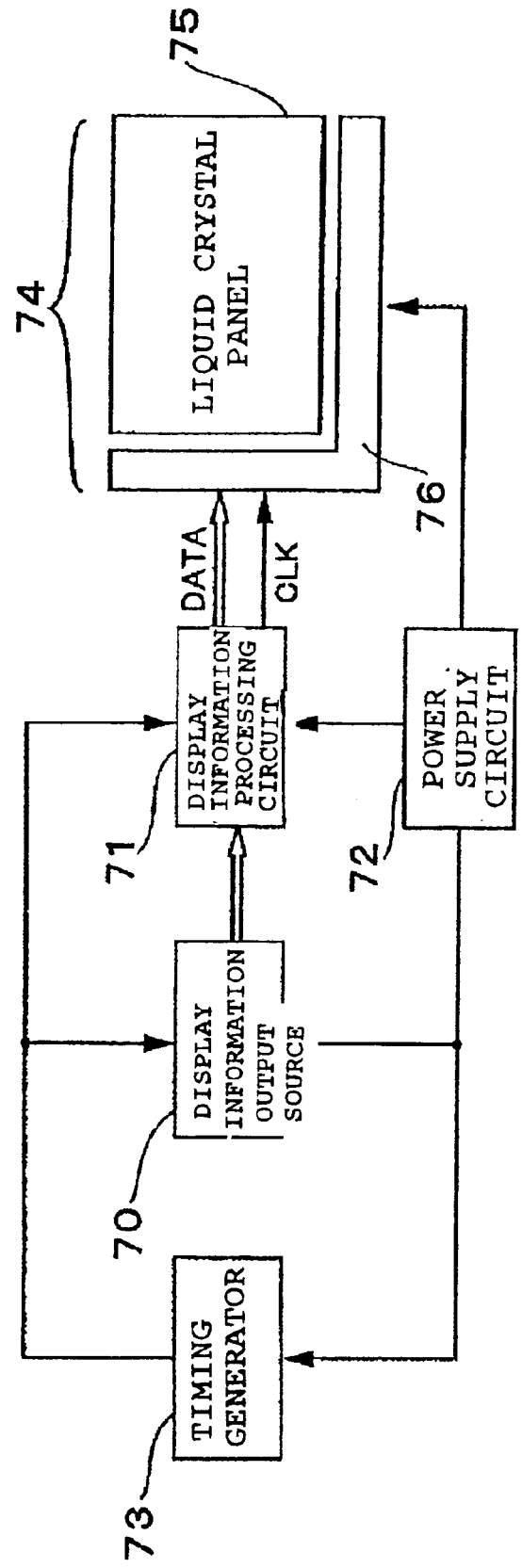

(FIG. 19)
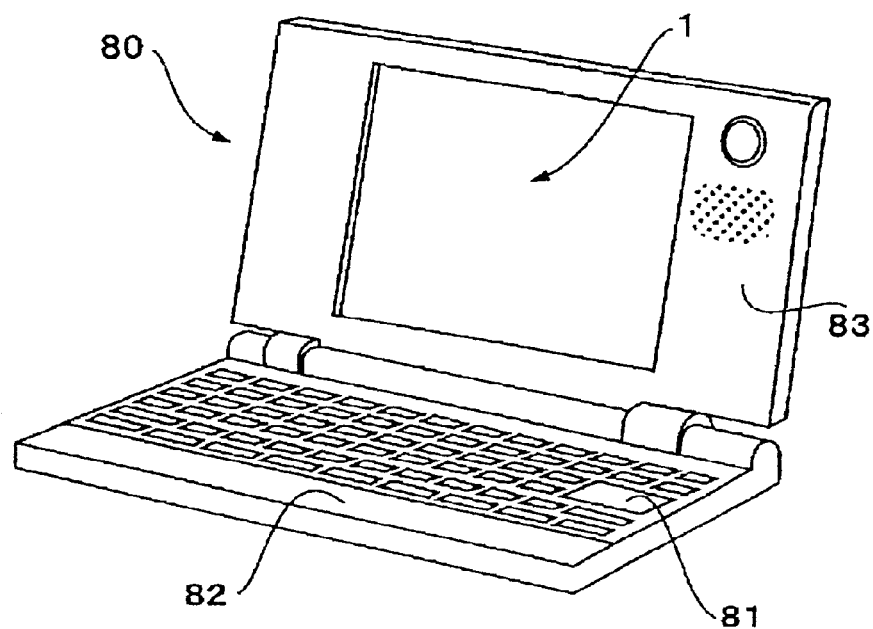
(FIG. 20)
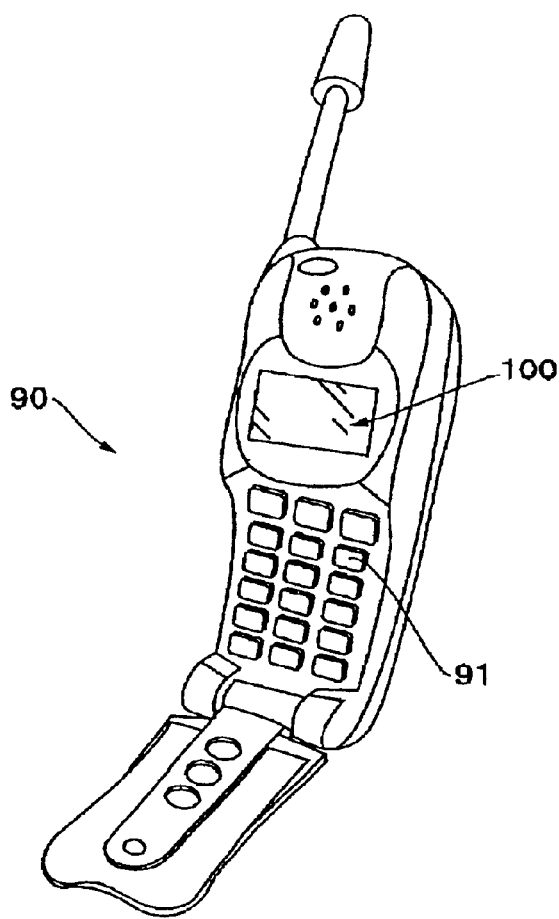

[FIG. 21]
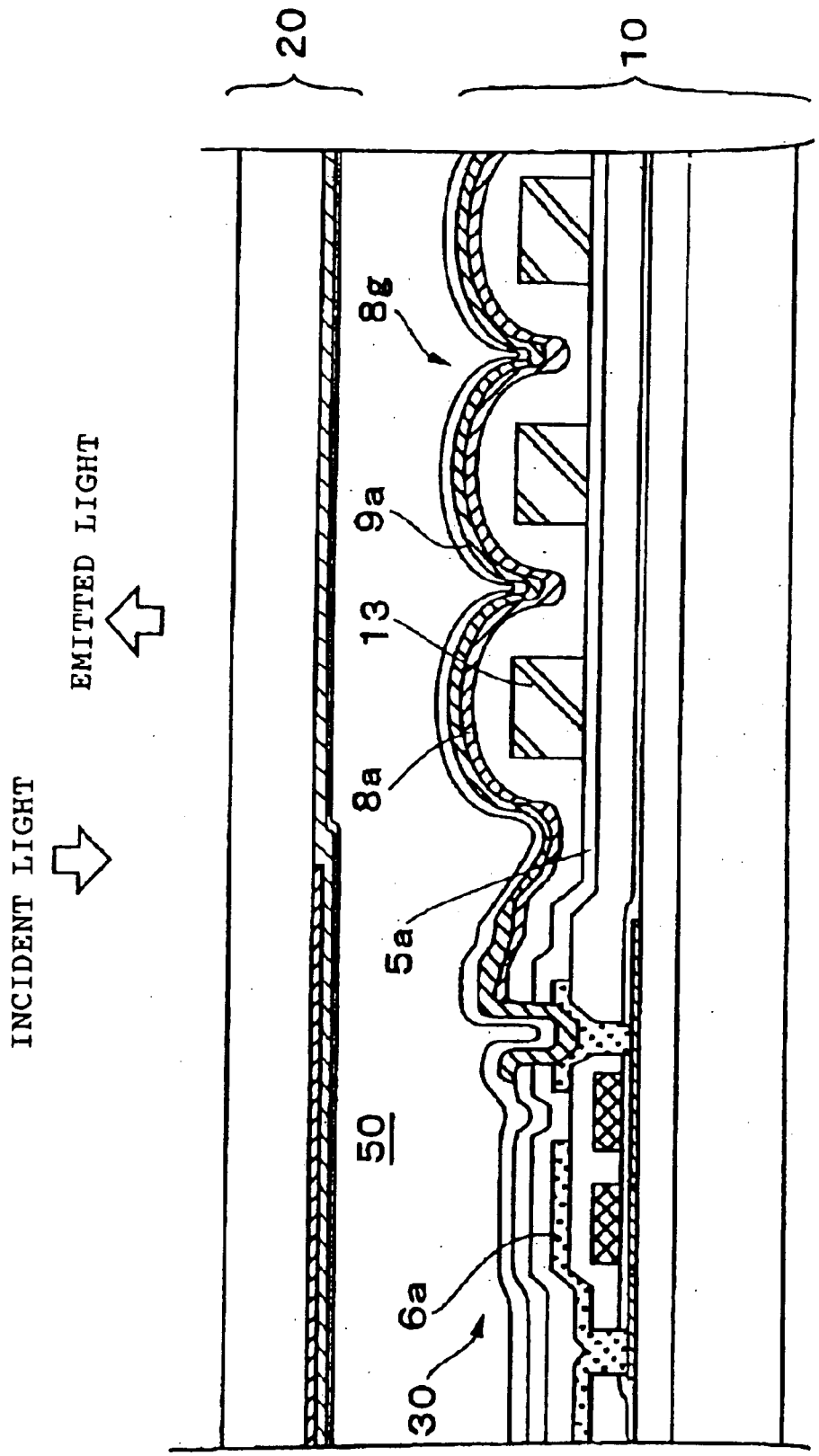
Prior Art

ELECTRO-OPTICAL DEVICE HAVING IRREGULARITY-FORMING THIN FILM AND ELECTRONIC APPARATUS

BACKGROUND OF THE INVENTION

1. Field of Invention

The present invention relates to an electro-optical device and an electronic apparatus using the same. More particularly, the present invention relates to the structure of a pixel of the electro-optical device.

2. Description of Related Art

Currently, electro-optical devices, such as liquid crystal devices, are used as direct viewing type display devices for various apparatuses. Of these electro-optical devices, in an active matrix type liquid crystal device using thin film transistors (TFTs) as a nonlinear element for pixel switching, as shown in FIG. 21, a TFT array substrate 10 and a counter substrate 20 hold liquid crystals as an electro-optical material therebetween. On the TFT array substrate 10 of these substrates mentioned above, there are provided TFTs 30 and pixel electrodes 9a which are each composed of a transparent conductive film, such as an ITO film, and are each electrically connected to a data line 6a via this TFT 30.

Among liquid crystal devices, in a reflective and a transflective liquid crystal device, a method in which a light reflector 8a for reflecting external light incident on the counter substrate 20 to the counter substrate 20 side is formed at a lower layer side of the pixel electrode 9a, and an image is displayed by using external light emitted from the counter substrate 20 side, which is incident on the counter substrate 20 and is then reflected off of the TFT array substrate 10 side, has been widely performed. In addition, by forming a light reflector at the counter substrate 20 side, external light incident on the TFT array substrate 10 side is reflected off of the counter substrate 20 side, so that an image can be displayed by the external light emitted from the TFT array substrate 10 side. However, in the structure described above, since light passes through the TFT array substrate 10, and the areas at which the TFT's 30 are formed do not allow light to pass therethrough, a bright display cannot be advantageously created. Furthermore, the structure in which a light reflector is provided at the opposite side of the array substrate 10 or the counter substrate 20 from the liquid crystal 50 has also been considered, however, in view of the brightness and parallax, the display quality thereof is significantly inferior to that of the internal electrode structure described above.

In either of the reflective or transflective liquid crystal device described above, when light reflected off of the light reflector 8a has a strong directionality, the viewing angle dependence, that is, a phenomenon in which the brightness of an image changes with change in viewing angle or the like, becomes apparent. Accordingly, when a liquid crystal device was manufactured in the past, a photosensitive resin composed of an acrylic resin or the like having a thickness of 800 to 1,500 nm was applied to a surface of a second interlayer insulation film 5a (surface protection film), and this photosensitive resin film was patterned by a photolithographic method so as to selectively leave an irregularity-forming photosensitive resin layer 13 having a predetermined pattern in an area which is at the lower layer side of the light reflector 8a and is overlaid therewith in plan view. Consequently, on the surface of the light reflector 8a formed above the upper layer side of the irregularity-forming photosensitive resin layer 13, an irregular pattern 8g is formed.

As a result, light incident on the counter substrate 20 reflects off the light reflector 8a while being diffused and enters the counter substrate 20, and hence, the viewing angle dependence of an image displayed on the liquid crystal device can be suppressed.

In the case described above, a TFT is described as an example of an active element for pixel switching, and in addition to that, as an active element, a thin-film diode element (TFD) such as a Metal Insulator Metal (MIM) element may also be used.

However, as in the case of a conventional liquid crystal device, in a method for forming the irregular pattern 8a on the surface of the light reflector 8a by using the irregularity-forming photosensitive resin layer 13, since a step of applying a photosensitive resin is additionally required, there has been a problem in that the manufacturing cost is increased. In addition, it is necessary to add a step of selectively leaving the photosensitive resin thus applied by using a photolithographic technique so as to form the irregularity-forming photosensitive resin layer 13, and hence, there has been a problem in that the manufacturing cost is increased.

SUMMARY OF THE INVENTION

In consideration of the problems described above, an object of the present invention is to provide an electro-optical device in which a light reflector having a light diffusion function can be formed in a preferable condition while an increase in manufacturing cost is minimized, and also to provide an electronic device using the same.

In order to solve the problems described above, an electro-optical device of the present invention can include substrates, an electro-optical material provided therebetween, and pixels on one of the substrate. Additionally, each pixel can include at least one wire, at least one insulation film which is provided on the uppermost wire, under the lowermost wire, or between the wires, a light reflector, and an active element for pixel switching connected to the at least one wire. Further, in an area which is at the lower layer side of the light reflector and which is overlaid therewith in plan view, an irregularity-forming thin-film can be selectively formed by patterning a thin-film so as to have a predetermined pattern. The thin-film can be composed of the same layer as that forming at least one of the at least one wire and the at least one insulation film, whereby a region is formed an irregular pattern on the surface of the light reflector.

In the present invention, in the area which is at the lower layer side and which is overlaid therewith in plan view, the thin-film, having the same layer as that forming at least one of the at least one wire and at least one insulation film which is provided on the uppermost wire, under the lowermost wire, or between the wires, is selectively patterned to form the irregularity-forming thin-film having a predetermined pattern. By using the steps and the irregularity caused by the presence of this irregularity-forming thin-film, the irregular pattern can be formed on the light reflector. Regardless whether the irregularity is formed on the light reflector, the at least one wire and the insulation film provide on the uppermost wire, under the lowermost wire, or between the wires must be formed. After predetermined thin-films are formed over the entire surface of the substrate, the insulation films described above are formed by, for example, patterning using a photolithographic method. As a result, by using the entire steps of forming the at least one wire and the insulation film on the uppermost wire, under the lower most wire, or between the wires, the irregularity-forming thin-film composed of the same layer of that forming each of the films described above can be selectively formed so as to have a predetermined pattern. Accordingly, without adding film-forming steps, a light reflector provided with a light diffusion function can be formed. In addition, the irregular-forming thin-film can be easily formed on the substrate at which the active element is not formed, and microfabrication for forming the active element can be performed without any problems.

The active element mentioned above may be nonlinear type two-terminal element such as a TFD element having an MIM structure, or may be a TFT. In addition, when a TFT is used, amorphous silicon may be used for an active layer, or polysilicon may be used for an active layer, and in addition, an inversely staggered, a normally-staggered, or a coplanar structure may be used.

In the present invention, a planarizing film can be preferably formed at the lower layer side of the light reflector and at the upper layer side of the irregularity-forming thin-film. When the structure is formed as described above, the steps and the irregularity caused by the presence of the irregularity-forming thin-film can be formed into a smooth shape with no edges by the planarizing film, and hence, an irregular pattern is provided on the surface of the light reflector, whereby the generation of the viewing angle dependence caused by edges can be prevented.

The average thickness of the planarizing film is preferably in the range of one-half to twice the height difference of the irregular pattern. When the average thickness of the planarizing film is more than twice the height difference of the irregular pattern, since the irregularity is eliminated by the planarizing film, the regular reflection component becomes too strong, and even thought a bright image can be obtained, the viewing angle dependence of an image is enhanced. In contrast, when the thickness of the planarizing film is less than one-half the height difference of the irregular pattern, the planarizing film cannot reliably eliminate edges, and hence, the viewing angle dependence caused by the edges is generated. Accordingly, when the thickness of the planarizing film is set in the range of one-half to twice the height difference of the irregular pattern, the viewing angle dependence can be suppressed, and in addition, the brightness of an image is also ensured.

In the present invention, the irregularity-forming thin-film may be formed of one layer, however, the irregularity-forming thin-film is preferably formed of two layers or more. In order to form an irregular pattern having a sufficient height difference on the surface of the light reflector, it is necessary to form an irregularity-forming thin-film having a thickness equivalent to the wavelength in the visible light region, however, in general, a thin-film having the thickness as described above is not formed in a TFT. Accordingly, in the case in which the irregularity-forming thin-film is formed of two layers or more, even when the thickness of one thin-film is small, an irregular pattern having a sufficient height difference can be formed on the surface of the light reflector.

In the present invention, for example, the structure that includes a conductive film composed of the same layer as that forming at least one of the wires may be used for the irregularity-forming thin-film. In the case described above, it is preferable that the irregularity-forming thin-film composed of the same layer as that forming one of the wire be electrically separated from the wire.

In the present invention, the active element described above is, for example, a TFT or a TFD element, and one of the wires is a scanning line.

In the present invention, when the active element is a TFT, the irregularity-forming thin-film can include at least a conductive film composed of the same layer as that forming the scanning line or the gate electrode. After a conductive film is formed over the entire surface of the substrate, the scanning lines or the gate electrodes are formed by patterning using a photolithographic method. Accordingly, by using the entire steps of forming the scanning line or the gate electrode, the irregularity-forming thin-film having a predetermined pattern composed of the same layer as that forming the scanning line or the gate electrode can be selectively formed, and hence, it is not necessary to add steps for forming the irregular pattern on the surface of the light reflector.

In the case described above, it is preferable that the irregularity-forming thin-film composed of the same layer as that forming the scanning line or the gate electrode be electrically separated from the scanning line and the gate electrode so as to prevent the scanning line from being short-circuited with other constituent elements via the irregularity-forming thin-film or from forming capacitive coupling.

In the present invention, when the active element is a TFT, the structure including a conductive film composed of the same layer as that forming the data line or the source electrode may be used for the irregularity-forming thin-film. As in the case of the scanning line and the gate electrode, after a conductive film is formed over the entire surface of the substrate, the data line or the source electrode is formed by patterning using a photolithographic method. Accordingly, by using the entire steps of forming the source electrode, the irregularity-forming thin-film having a predetermined pattern composed of the same layer as that forming the data line or the source electrode can be selectively formed, and hence, it is not necessary to add steps for forming the irregular pattern on the surface of the light reflector.

In the case described above, it is preferable that the irregularity-forming thin-film composed of the same layer as that forming the data line or the source electrode be electrically separated from the data line and the source electrode so as to prevent the data line and the source electrode from being short-circuited with other constituent elements via the irregularity-forming thin-film.

When the structure described above is used, the thickness of each conductive film described above is preferably 500 nm or more.

In the present invention, at least one-half of the conductive film in the thickness direction is preferably formed of an aluminum film, a tantalum film, a molybdenum film, or an alloy film primarily composed of the above metal. In addition, these conductive films are preferably processed by dry etching. When the irregularity-forming thin-film is formed of a conductive film, this conductive film is formed so as to have a large thickness, and when the metal mentioned above is used, advantages in that the film stress is relatively low, the growth rate is high, and patterning can be performed by dry etching while the tapered shape is easily controlled can be obtained.

In the present invention, the structure including at least an insulation film may be used for the irregularity-forming thin-film.

In the present invention, when the active element is a thin-film transistor, for example, the structure including at least an interlayer insulation film for insulating between the gate and the source may be used for the irregularity-forming thin-film as the insulation film mentioned above. After an insulation film is formed over the entire surface of the substrate, the interlayer insulation film described above is formed by patterning using a photolithographic technique so as to form contact holes in the insulation film mentioned above. Accordingly, by using the entire steps of forming the interlayer insulation film and contact holes, the irregularity-forming thin-film having a predetermined pattern composed of the same layer as that forming the interlayer insulation film can be selectively formed, and hence, it is not necessary to add steps of forming the irregular pattern on the surface of the light reflector.

In the present invention, for example, the structure including an underlying protection film formed under the active element may be used for the irregularity-forming thin-film as the insulation film mentioned above. Since this underlying film is formed for protecting the active element and the wires, when the irregularity-forming thin-film is formed, it is not necessary to add film-forming steps. In addition, since the gate insulation film and the interlayer insulation film are formed at the upper layer side of the underlying protection film, when contact holes are formed in the gate insulation film and the interlayer insulation film, the underlying protection layer can be patterned by using the entire steps of forming the contact holes. Accordingly, by using other steps, the irregularity-forming thin-film having a predetermined pattern composed of the same layer as that forming the underlying protection film can also be selectively formed, and hence, it is no longer necessary to add steps of forming the irregular pattern on the surface of the light reflector.

In the present invention, the irregularity-forming thin-film may include, for example, a protection insulation film as the insulation film described above at the upper layer side of the active element and the wires. Since this protection insulation film is formed for protecting the active element and the wires, and contact holes are then provided in the insulation film by patterning using a photolithographic technique, when the irregularity-forming thin-film is formed, it is no longer necessary to add a film-forming step and a patterning step.

In the present invention, at least one-half of the insulation film in the thickness direction is preferably formed of a silicon oxide film. When the irregularity-forming thin-film is formed of an insulation film, this insulation film is formed so as to have a large thickness, and when a silicon oxide film is used, advantages in that the film stress is relatively low, the growth rate is high, and a superior shape can be patterned by dry etching can be obtained.

In the present invention, when the active element is a TFT, and a thin-film composed of the same layer as that forming the interlayer insulation film is used as the irregularity-forming thin-film, a semiconductor film composed of the same layer as that forming an active layer of the thin-film transistor is preferably overlaid with concave portions forming the irregular pattern in plan view. When the thin-film composed of the same layer as that forming the interlayer insulation film is removed by etching in an area corresponding to the concave portion of the irregular pattern, an underlying film provided under the area described above or the substrate material may be exposed to an etching solution or an etching gas. However, when the semiconductor film composed of the same layer as that forming the active layer of the TFT is left behind at the area corresponding to the concave portion, this semiconductor film serves as an etching stopper, and the layer provided thereunder is prevented from being removed by etching. Accordingly, the effects of preventing contamination and controlling the concave shape can be obtained.

In the present invention, the irregular pattern preferably has no area in which neighboring convex portions thereof are repeated at a lateral distance of 20 $\mu$m or less. In the irregular pattern, when there is an area in which neighboring convex portions are repeated at a lateral distance of 20 $\mu$m or less, the interference color is generated by the relationship with light wavelength, however, when the repeating area described above is not present, the generation of interference color can be prevented.

In the present invention, the height difference of the irregular pattern is preferably 500 nm or more, and in particular, the height difference of the irregular pattern is more preferably 800 nm or more. When the height difference of the irregular pattern is too small, in the scattering properties, the frequency dependence is generated in the visible region, and an image is colored, however, when the height difference of the irregular pattern is 500 nm or more, the coloration described above can be reduced, and in particular, when the height difference is 800 nm or more, the coloration can be prevented.

In the present invention, the irregularity-forming thin-film is preferably formed into a planar shape provided with no sharp edges at the periphery thereof. The structure described above can be realized by setting one side length of an aperture to the vicinity of the maximum resolution of an exposure machine by using CAD when an exposure mask is designed. For example, by using a drawn mask in a polygonal shape having a length which is approximately twice the resolution of a photolithographic machine to be used, the irregularity-forming thin-film described above is formed. When the thin-film is thus formed, since portions having an acute angle are not present at the periphery of the irregularity-forming thin-film, the generation of the frequency dependency of the scattering properties can be prevented, and the generation of the viewing angle dependence of an image can also be prevented.

In the present invention, the convex portions and concave portions forming the irregular pattern each have a flat portion, and the flat portion with an inclination angle of 3° or less with respect to the substrate preferably has a planar dimension of 10 $\mu$m or less. When the structure is thus formed, the generation of the frequency dependency of the scattering properties can be prevented, and the generation of the viewing angle dependence of an image can also be prevented.

In the present invention, the lateral distance between the neighboring convex portions of the irregular pattern is preferably in the range of five to twenty times the height difference thereof. When the structure is formed as described above, superior level of the viewing angle dependence and the brightness of an image can both be obtained. In other words, when the lateral distance between the neighboring convex portions is more than twenty times the height difference of the irregular pattern, the regular reflection component becomes too strong, and even though a bright image can be obtained in the direction of total reflection, the viewing angle dependence of an image is generated. In contrast, when the lateral distance between the neighboring convex portions is less than five times the height difference of the irregular pattern, the viewing angle dependence is generated. Accordingly, when the lateral distance between the neighboring convex portions is set in the range of five to twenty times the height difference of the irregular pattern, the viewing angle dependence can be suppressed, and in addition, the brightness of an image can also be ensured.

In the present invention, the variation in inclination angle of the side surfaces of the convex portions, which form the irregular pattern, is preferably 10° or less in one plane and more preferably 5° or less. When the variation in inclination angle is large, the irregularity of reflection brightness is generated, however, when the variation in inclination angle is reduced to the level mentioned above, the generation of the irregularity of reflection brightness can be prevented. When the irregularity-forming thin-film having a predetermined pattern is formed by dry etching, such as RIE (reactive ion etching) or high-density plasma etching, the structure described above can be realized.

In the present invention, the slopes of the side surfaces of each convex portion forming the irregular pattern are preferably asymmetric with respect to the center of the corresponding convex portion. When the structure is formed described above, reflected light has anisotropic properties to some extent, and by using this anisotropic properties, the quality of an image can be improved. For example, the convex portions forming the irregular pattern are each preferably formed so that the side surface having a steeper slope faces the side in the distinct viewing direction. When the structure is formed as described above, since the scattering component in distinct viewing direction can be enhanced, the brightness of the entire image can be increased while the brightness in distinct viewing direction is maintained. When the structure described above is applied to a display using a TN liquid crystal, the side surface having a steeper slope more preferably faces the side in the distinct viewing direction set by the orientation of liquid crystal, which is determined by a rubbing direction.

When the structure having an asymmetrical pattern as described above is formed, and the irregularity-forming thin-film at least can include a plurality of conductive films, protruding patterns formed of the plurality of conductive films which are left behind overlap each other in plan view, and an asymmetrical pattern in which the overlap center and the centers of the individual protruding patterns do not coincide with each other is formed. Alternatively, when the irregularity-forming thin-film at least includes a plurality of insulation films, recessed patterns which are openings formed in the plurality of insulation films overlap each other in plan view, and an asymmetrical pattern in which the overlap center and the centers of the individual recessed patterns do not coincide with each other is formed. In addition, when the irregularity-forming thin-film includes at least one insulation film and at least one conductive film, the centers of protruding patterns formed of the conductive films which are left behind and the centers of recessed patterns which are openings formed in the insulation films are asymmetrical in plan view.

In the present invention, it is preferable that a remaining pattern at the lower layer side of the convex portion, which forms the irregular pattern, be always formed outside a remaining pattern at the upper layer side, and that an aperture pattern at the lower layer side of the concave portion, which forms the irregular pattern, be formed inside an aperture pattern at the upper layer side of the concave portion so that the irregularity-forming thin-film has a forward-tapered shape. In order to form the structure described above, when the irregularity-forming thin-film includes at least a plurality of conductive films, a protruding pattern composed of the conductive film which is left behind at the upper side is always formed inside the region at which a protruding pattern composed of the conductive film which is left behind at the lower side is formed. In addition, when the irregularity-forming thin-film includes at least a plurality of insulation films, a recessed pattern which is an opening provided in the insulation film at the lower side is always formed inside the region at which a recessed pattern which is an opening provided in the insulation film at the upper side is formed. Furthermore, when the irregularity-forming thin-film includes at least one insulation film and at least one conductive film, a protruding pattern composed of the conductive film which is left behind and a recessed pattern which is an opening provided in the insulation film have no portions to overlap each other in plan view.

That is, when the irregularity-forming thin-film is formed of two layers or more, and when a remaining pattern (protruding pattern) is formed, the irregularity-forming thin-film located at the upper layer side is formed inside the region of the irregularity-forming thin-film located at the lower layer side. In contrast, when an aperture pattern (recessed pattern) is formed, in a manner opposite to that described above, an opening provided in the irregularity-forming thin-film located at the upper layer side is formed outside the aperture region provided in the irregularity-forming thin-film located at the lower layer side. When the structure is formed as described above, the irregularity-forming thin-film at the upper layer side can be prevented from forming an overhang structure (inversely-tapered structure), and film peeling and short-circuiting can be reduced, whereby the structure can be manufactured with good yield. In addition, in the case in which the irregularity-forming thin-film is formed by the combination of the concave portions and the convex portions, when the aperture portion (concave portion) and the remaining portion (convex portion) are formed so as not to overlap each other in plan view, the steps formed by the irregularity-forming thin-film located at the lower layer side are not eliminated by the irregularity-forming thin-film located at the upper layer side. Accordingly, when the structure as described above is used, and when the irregularity-forming thin-film including a plurality of insulation films or a plurality of conductive films, even though the thickness of each insulation film or each conductive film is 800 nm or less, an irregular pattern having a sufficient height difference can be formed on the surface of the light reflector.

In the present invention, the electro-optical material can be, for example, liquid crystal.

The electro-optical device according to the present invention can be used as a display device of an electronic device, such as a mobile phone or a mobile computer.

BRIEF DESCRIPTION OF THE DRAWINGS

The invention will be described with reference to the accompanying drawings wherein like numbers represent like elements, and wherein:

FIG. 1 is a plan view showing an electro-optical device when viewed from a counter substrate side;

FIG. 2 is a cross-sectional view taken along the line H-H' in FIG. 1;

FIG. 3 is an equivalent circuit diagram of various elements and wires formed in a plurality of pixels disposed in a matrix of an electro-optical device;

FIG. 4 is a plan view showing the structure of pixels formed on a TFT array substrate of an electro-optical device of a first embodiment of the present invention;

FIG. 5 is a cross-sectional view of the electro-optical device, taken along the line A-A' in FIG. 4, of the first embodiment of the present invention;

FIG. 6 is an enlarged cross-sectional view of an irregular pattern formed on the surface of a light reflector, in an area other than the region of a TFT for pixel switching, of the electro-optical device shown in FIG. 5;

FIGS. 7(A) to (F) are cross-sectional views showing steps of a method for manufacturing the TFT array substrate of the electro-optical device of the first embodiment according to the present invention;

FIGS. 8(A) to (E) are cross-sectional views showing steps of a manufacturing method for the TFT array substrate of the electro-optical device of the first embodiment according to the present invention, the steps being sequentially performed after the steps shown in FIG. 7;

FIGS. 9(A) to (D) are cross-sectional views showing steps of the manufacturing method for the TFT array substrate of the electro-optical device of the first embodiment according to the present invention, the steps being sequentially performed after the steps shown in FIG. 8;

FIGS. 10(A) to (D) are cross-sectional views showing steps of the manufacturing method for the TFT array substrate of the electro-optical device of the first embodiment according to the present invention, the steps being sequentially performed after the steps shown in FIG. 9;

FIGS. 11(A) and (B) are cross-sectional views showing particular steps of a manufacturing method for a TFT array substrate of an electro-optical device of a second embodiment according to the present invention;

FIG. 12 is an enlarged cross-sectional view of an irregular pattern formed on the surface of a light reflector, in an area other than the region of a TFT for pixel switching, of the electro-optical device of the second embodiment according to the present invention;

FIGS. 13(A) and (B) are cross-sectional views showing particular steps of a manufacturing method for a TFT array substrate of an electro-optical device of a third embodiment according to the present invention;

FIG. 14 is an enlarged cross-sectional view of an irregular pattern formed on the surface of a light reflector, in an area other than the region of a TFT for pixel switching, of the electro-optical device of the third embodiment according to the present invention;

FIG. 15 is an enlarged cross-sectional view of an irregular pattern formed on the surface of a light reflector, in an area other than the region of a TFT for pixel switching, of an electro-optical device of a fourth embodiment according to the present invention;

FIG. 16 is an enlarged cross-sectional view of an irregular pattern formed on the surface of a light reflector, in an area other than the region of a TFT for pixel switching, of an electro-optical device of a fifth embodiment according to the present invention;

FIG. 17 is a cross-sectional view of an electro-optical device of a sixth embodiment according to the present invention;

FIG. 18 is block diagram showing the circuit structure of an electronic apparatus using the electro-optical device of the present invention as a display device;

FIG. 19 is a view illustrating a mobile type personal computer that is an electronic apparatus using the electro-optical device according to one embodiment of the present invention;

FIG. 20 is a view illustrating a mobile phone that is an electronic apparatus using the electro-optical device according to one embodiment of the present invention; and FIG. 21 is a cross-sectional view of a conventional electro-optical device.

DETAILED DESCRIPTION OF PREFERRED EMBODIMENTS

FIG. 1 is a plan view showing an electro-optical device to which the present invention is applied and various constituent elements thereof when viewed from a counter substrate side, and FIG. 2 is a cross-sectional view taken along the line H-H' in FIG. 1. FIG. 3 is an equivalent circuit diagram of various elements, wires, and the like of a plurality of pixels formed in a matrix in an image display region of an electro-optical device. In the figures used for illustrating this embodiment, in order to recognize individual layers and individual members in the figure, the individual layers and the individual members are drawn in scales different from each other.

In FIGS. 1 and 2, in an exemplary electro-optical device 100 of this embodiment, between a TFT array substrate 10 and a counter substrate 20 bonded together with a sealing material 52, liquid crystal 50 used as an electro-optical material is provided, and inside the area at which the sealing material 52 is used, a peripheral delimiter 53 composed of a shading material is formed. Outside the area at which the sealing material 52 is used, a data line drive circuit 101 and a mounted terminal 102 are formed along one side of the TFT array substrate 10, and along two sides adjacent to the one side mentioned above, scanning line drive circuits 104 are formed. Along one remaining side of the TFT array substrate 10, a plurality of wires 105 connecting between the scanning line drive circuits 104 provided on both sides of the image display region is provided. In addition, a precharge circuit and an inspection circuit may be provided in areas under the peripheral delimiter 53 or the like in some cases. Furthermore, on at least one position of each corner portion of the counter substrate 20, a connection member 106 for electrically connecting the TFT array substrate 10 to the counter substrate 20 is formed.

Instead of forming the data line drive circuit 101 and the scanning line drive circuit 104 on the TFT array substrate 10, for example, a TAB (tape automated bonding) substrate provided with a drive LSI thereon may be electrically and mechanically connected to a terminal group formed at the peripheral portion of the TFT array substrate 10 via an anisotropic conductive film. In the electro-optical device 100, in accordance with the type of liquid crystal 50 to be used, that is, in accordance with an operation mode, such as a TN (twisted nematic) mode or an STN (super TN) mode, and a display mode, such as a normally white mode or normally black mode, an alignment layer, a retardation film, a polarizer, and the like are each disposed in a predetermined direction, however, they are not shown in the figures. In addition, when the electro-optical device 100 is formed for color display, color filters RGB together with a protection film therefor are formed on the counter substrate 20 in an area facing each pixel electrode (described later) formed on the TFT array substrate 10.

In the image display region of the electro-optical device 100 having the structure described above, as shown in FIG. 3, a plurality of pixels 100a are formed in a matrix, a pixel electrode 9a and a TFT 30 for pixel switching to drive this pixel electrode 9a are formed in each pixel 100a, and data lines 6a supplying pixel signals S1, S2 . . . Sn are connected to the sources of the TFT's 30. The pixel signals S1, S2 . . . Sn input to the data lines 6a may be sequentially supplied in that order or may be input to each group formed of a plurality of data lines 6a adjacent to each other. In addition, scanning lines 3a are electrically connected to the gates of the TFT's 30 and are formed so as to sequentially input scanning signals G1, G2 . . . Gm pulse-wise in that order to the scanning lines 3a at a predetermined timing. The pixel electrodes 9a are electrically connected to the drains of the TFT's 30, and when the TFT's 30 functioning as a switching element are placed in an ON state for a predetermined period, the image signals S1, S2 . . . Sn supplied from the data lines 6a are input to corresponding pixels at a predetermined timing. As described above, the image signals S1, S2, . . . , Sn having a predetermined level input to the liquid crystal via the pixel electrodes 9a are each retained for a predetermined time between the pixel electrode 9a and the counter electrode 21 of the counter substrate 20 shown in FIG. 2.

In accordance with changes in orientation and regularity of a molecular aggregate of the liquid crystal 50 depending on the level of an applied voltage, light is modulated, and hence, gray scale display can be performed. When a normally-white mode is performed, the amount of incident light passing through the liquid crystal 50 is decreased in accordance with an applied voltage, and when a normally-black mode is performed, the amount of incident light passing through the liquid crystal 50 is increased in accordance with an applied voltage. As a result, on the whole, light having a contrast in compliance with each of the image signals S1, S2 . . . Sn is emitted from the electro-optical device 100.

In order to avoid leakage of the retained image signals S1, S2 . . . Sn, a storage capacitor 60 may be provided parallel to a liquid crystal capacitor formed between the pixel electrode 9a and the counter electrode in some cases. For example, a voltage applied to the pixel electrode 9a is retained in the storage capacitor 60 for an application time of a source voltage multiplied by the number of scanning lines or more. Accordingly, the charge-retention properties can be improved, and an electro-optical device 100 having high contrast can be realized. As a method for forming the storage capacitor 60, as shown in FIG. 3 by way of example, a Cs on common structure may be formed between the drain and a capacitive line 3b which is a wire forming the storage capacitor 60, or a Cs on gate structure between the drain and the scanning line 3a described above may be formed.

FIG. 4 is a plan view of a plurality of pixels adjacent to each other provided on the TFT array substrate used in the electro-optical device of this embodiment. FIG. 5 is a cross-sectional view of a part of the electro-optical device taken along the line A-A' shown in FIG. 4. FIG. 6 is an enlarged cross-sectional view showing an irregular pattern formed on the surface of a light reflector, which is provided in an area outside the area at which the TFT for pixel switching is formed, of the electro-optical device shown in FIG. 5.

In FIG. 4, on the TFT array substrate 10, a plurality of pixel electrodes 9a composed of transparent ITO (Indium Tin Oxide) films are formed in a matrix, and the TFT 30 for pixel switching is connected to each pixel electrode 9a. In addition, along the boundaries of the pixel electrode 9a in the longitudinal and the lateral directions, the data line 6a, the scanning line 3a, and the capacitive line 3b are formed. The TFT 30 is connected to the data line 6a and the scanning line 3a. In other words, the data line 6a is electrically connected to a highly doped source region Id of the TFT 30 via a contact hole, and the pixel electrode 9a is electrically connected to a highly doped drain region 1e of the TFT 30 via a contact hole. In addition, the scanning line 3a is extended so as to face a channel region 1a' of the TFT 30. The storage capacitor 60 is composed of a lower electrode, which is formed by imparting conductivity to an extended portion 1f of a semiconductor film 1 for forming the TFT 30 for pixel switching, and the capacitive line 3b used as an upper electrode provided above this lower electrode 41.

In the cross-section along the line A-A' of the pixel region having the structure described above, as shown in FIG. 5, on the surface of a transparent substrate 10' for forming the TFT array substrate 10, an underlying protection film 11a composed of a silicon oxide film (insulation film) 300 to 500 nm thick is formed, and on the surface of this underlying protection film 11a, an island-shaped semiconductor film 1a having a thickness of 50 to 100 nm is formed. On the surface of the semiconductor film 1a, a gate insulation film 2a composed of a silicon oxide film having a thickness of approximately 50 to 150 nm is formed, and on the surface of this gate insulation film 2a, the scanning line 3a having a thickness of 300 to 800 nm is extended as a gate electrode. An area of the semiconductor film 1a facing the scanning line 3a via the gate insulation film 2a is the channel area 1a'. On one side of this channel area 1a', a source region composed of a lightly doped source region 1b and the heavily doped source region 1d is formed, and on the other side, a drain region composed of a lightly doped drain region 1c and the heavily doped drain region 1e is formed.

At the surface side of the TFT 30 for pixel switching, a first interlayer insulation film 4a composed of a silicon oxide film 300 to 800 nm thick and a second interlayer insulation film 5a (surface protection film) composed of a silicon nitride film 100 to 300 nm thick are formed. On the surface of the first interlayer insulation film 4a, a data line 6a having a thickness of 300 to 800 nm is formed, and this data line 6a is electrically connected to the highly doped source region 1d via a contact hole formed in the first interlayer insulation film 4a. On the surface of the first interlayer insulation film 4a, a drain electrode 6b is formed, which is simultaneously formed with the data line 6a, and this drain electrode 6b is electrically connected to the highly doped drain region 1e via a contact hole formed in the first interlayer insulation film 4a.

On the second interlayer insulation film 5a, a film formed by firing a polysilazane coating film or a transparent planarizing film 7 composed of an acrylic resin is formed. On the surface of this planarizing film 7, the light reflector 8a composed of an aluminum film or the like is formed.

On the light reflector 8a, the pixel electrode 9a composed of an ITO film can be formed. The pixel electrode 9a is directly formed on the surface of the light reflector 8a, and the pixel electrode 9a and the light reflector 8a are electrically connected to each other. In addition, the pixel electrode 9a is electrically connected to the drain electrode 6b via a contact hole formed in the planarizing film 7 and the second interlayer insulation film 5a.

On the surface side of the pixel electrode 9a, an alignment layer 12 composed of a polyimide film is formed. This alignment layer 12 is a layer formed of a polyimide film processed by rubbing treatment.

The capacitive line 3b used as the upper electrode faces the extended portion 1f (lower electrode) extended form the highly doped drain region 1e via an insulation film (dielectric film) which is simultaneously formed with the gate insulation film 2a, and hence, the storage capacitor 60 is formed.

The TFT 30 preferably has an LDD structure as described above, however, an offset structure in which implantation of impurity ions is not performed in areas corresponding to the lightly doped source region 1b and the lightly doped drain region 1c may also be used. In addition, the TFT 30 may be a self-alignment type TFT which has a highly doped source and a drain region formed by implanting impurity ions at a high concentration in a self-alignment manner using the gate electrode (a part of the scanning line 3a) as a mask.

In addition, in this embodiment, a TFT 30 having a single gate structure in which one gate electrode (scanning line 3a)

is only provided between the source and the drain regions is used; however, at least two gate electrodes may be provided therebetween. In the case described above, the structure is formed so that the same signal is input to each gate electrode. As described above, when a TFT 30 having a dual gate (double gate) or a triple gate structure is formed, current leakage at the junctions of the channel with the drain and the source regions can be prevented, and the current in an OFF state can be decreased. When at least one of the gate electrodes mentioned above has an LDD structure or an offset structure, the OFF current can be further decreased, and hence, a stable switching element can be obtained.

In each pixel 100*a* provided on the TFT array substrate 10 having the structure described above, as shown in FIGS. 5 and 6, an irregular pattern 8*g* having convex portions 8*b* and concave portions 8*c* is formed in a region of the surface of the light reflector 8*a* at which the TFT 30 is not formed (see FIG. 4).

When the irregular pattern 8*g* as described above is formed, in the TFT array substrate 10 of this embodiment, in the area in each pixel 100*a* at which the TFT 30 is not formed, irregularity-forming thin-film 11*g*, which is an insulation film composed of the same layer as that forming the underlying protection film, is selectively formed in a predetermined pattern on regions corresponding to those at which the convex portions 8*b* of the irregular pattern 8*g* are formed. In contrast, in a region corresponding to the concave portion 8*c* of the irregular pattern 8*g*, the insulation film which is composed of the same layer as that forming the underlying protection film 11*a* is removed, and the irregularity-forming thin-film 11*g* is not formed.

Secondly, on irregularity-forming thin-film 11*g*, an irregularity-forming thin-film 2*g* which is an insulation film composed of the same layer as that forming the gate insulation film 2*a* is formed, and the irregularity-forming thin-film 2*g* is precisely provided on the irregularity-forming thin-film 11*g*.

Thirdly, on the irregularity-forming thin-film 2*g*, an irregularity-forming thin-film 3*g* which is a conductive film composed of the same layer as that forming the scanning line 3*a* is formed, and this irregularity-forming thin-film 3*g* is not extended past the region of the irregularity-forming thin-film 2*g* and is provided at the center thereof. The irregularity-forming thin-film 3*g* is electrically separated from the scanning line 3*a* (gate electrode).

Fourthly, on the surface of the irregularity-forming thin-film 3*g*, an irregularity-forming thin-film 4*g* which is an insulation film composed of the same layer as that forming the first interlayer insulation film 4*a* is formed, and this irregularity-forming thin-film 4*g* is not extended past the region of the irregularity-forming thin-film 2*g* and is provided at the center thereof. However, the irregularity-forming thin-film 4*g* is formed wider than the irregularity-forming thin-film 3*g* and is extended past the region of the irregularity-forming thin-film 3*g*.

Fifthly, on the surface of the irregularity-forming thin-film 4*g*, an irregularity-forming thin-film 6*g* which is a conductive film composed of the same layer as that forming the data line 6*a* is formed, and this irregularity-forming thin-film 6*g* is not extended past the region of the irregularity-forming thin-film 4*g* and is provided at the center thereof. The irregularity-forming thin-film 6*g* is electrically separated from the data line 6*a* (source electrode).

Sixthly, on the surface of the irregularity-forming thin-film 6*g*, an irregularity-forming thin-film 5*g* which is an insulation film composed of the same layer as that forming the second interlayer insulation film 5*a* is formed, and this irregularity-forming thin-film 5*g* is not extended past the region of the irregularity-forming thin-film 4*g* and is provided at the center thereof. However, the irregularity-forming thin-film 5*g* is formed wider than the irregularity-forming thin-film 6*g* and is extended past the region of the irregularity-forming thin-film 6*g*.

At the surface side of the irregularity-forming thin-film 6*g* thus formed, a film formed by firing a polysilazane coating film or a transparent planarizing film 7 composed of an acrylic resin is formed, and on the surface of this planarizing film 7, a light reflector 8*a* composed of an aluminum film or the like is formed. Accordingly, in this embodiment, by the steps and irregularity formed by the irregularity-forming thin-films 11*g*, 2*g*, 3*g*, 4*g*, 6*g*, and 5*g* and a non-formation region at which those irregularity-forming thin-films described above are not formed, on the surface of the light reflector 8*a*, an irregular pattern 8*g* having a height difference H of 500 nm or more (a value approximately equivalent to the sum of the thicknesses of the irregularity-forming thin-films 11*g*, 2*g*, 3*g*, 4*g*, 6*g*, and 5*g*) or having a height difference of 800 nm or more is formed. In addition, this irregular pattern 8*g* has a smooth shape with no edges due to the planarizing film 7. In this embodiment, the thickness of the planarizing film 7 is set in the range of from one-half to twice the height difference H of the irregular pattern 8*g*.

In addition, all irregularity-forming thin-films 11*g*, 2*g*, 3*g*, 4*g*, 6*g*, and 5*g* are formed so as not to form acute angles at the peripheries thereof in plan view (see FIG. 4).

In the in-plane direction of the TFT array substrate 10, the irregular pattern 8*g* does not have an area in which the neighboring convex portions 8*b* are repeated at a lateral distance L of 20 µm or less, and the irregular pattern 8*g* is formed so that the average lateral distance L between the neighboring convex portions 8*b* is in the range of from five to twenty times the height difference H of the irregular pattern 8*g*.

Furthermore, in order to form the convex portions 8*b* and the concave portions 8*c*, which form the irregular pattern 8*g*, so that each flat portion thereof with an inclination angel of 3° or less has a planar dimension of 10 µm or less, the irregularity-forming thin-films 11*g*, 2*g*, 3*g*, 4*g*, 6*g*, and 5*g* and the opening portion, which are provided at the lower layer side, are formed so that each flat portion thereof with an inclination angle α of 3° or less has a planar dimension of 10 µm or less.

In addition, in order to form the convex portions 8*b* forming the irregular pattern 8*g* so that the variation in inclination angle of the side surfaces of the convex portions 8*b* is 10° or less, or 5° or less, the irregularity-forming thin-films 11*g*, 2*g*, 3*g*, 4*g*, 6*g*, and 5*g* are formed so that the variation in inclination angle β is 10° or less, or 5° or less.

In FIGS. 5 and 6, in the counter substrate 20, a shielding film 23, which is called a black matrix or a black stripe, is formed on areas corresponding to the boundaries of the pixel electrodes 9*a* in the longitudinal and the lateral directions provided for the TFT array substrate, and on the shielding film 23, a counter electrode 21 composed of an ITO film is formed. In addition, on the counter electrode 21, an alignment film 22 composed of a polyimide film is formed, and this alignment film 22 is a polyimide film processed by rubbing treatment.

The electro-optical device 100 having the structure described above is a reflective liquid crystal device, and the light reflector 8*a* composed of an aluminum film or the like is formed under the pixel electrodes 9*a*. Accordingly, since light which enters from the counter substrate 20 side is reflected off of the TFT array substrate 10 side and is then emitted from the counter substrate 20 side, when light modulation is performed during this period described above in each pixel 100*a* by using the liquid crystal 50, a desired image can be displayed by disposing a proper polarizer and a retardation film at the outside of the counter substrate 20 using external light (reflection mode).

In addition, in the electro-optical device 100, for example, when the light reflector 8*a* is formed so as not to be provided in an area 8' shown by a chain line in FIG. 4, a transflective electro-optical device can be formed. In the case described above, when a backlight device is (not shown) is provided at the TFT array substrate 10 side, and light emitted from this backlight device enters the electro-optical device 100 from the TFT array substrate 10 side, this light can reach the counter substrate 20 side via a part of the pixel electrode 9*a* of each pixel 100*a* at which the light reflector 8*a* is not provided. Accordingly, when light modulation is performed in each pixel 100*a* by using the liquid crystal 50, a desired image can be displayed by disposing proper polarizers and retardation films at the outsides of the counter substrate 20 and the TFT array substrate 10 using the light emitted from the backlight device (transmission mode).

In addition, in this embodiment, in an area which is at the lower layer side of the light reflector 8*a* and is overlaid therewith in plan view, the irregularity-forming thin-films 11*g*, 2*g*, 3*g*, 4*g*, 6*g*, and 5*g* are selectively formed by patterning thin-films which are the same layers as those forming the gate electrode (scanning line 3*a*), the source electrode (data line 6*a*), and individual insulation films so as to have predetermined patterns, and by using the steps and the irregularity caused by the presence of these irregularity-forming thin-films, the irregular pattern 8*a* is formed on the light reflector 8*a*. Accordingly, when an image is displayed in a reflective mode, and when light incident on the counter substrate 20 is reflected off of the light reflector 8*a*, the light is diffused, and hence, the generation of viewing angle dependence of an image is unlikely to occur. In the steps described above, since the gate electrode (scanning line 3*a*), the source electrode (data line 6*a*), the first interlayer insulation film 4*a*, and the second interlayer insulation film 5*a* are formed by patterning thin-films provided over the entire surface of the substrate 10' using a photolithographic technique, by using the entire steps of forming the gate electrode (scanning line 3*a*), the source electrode (data line 6*a*), the first interlayer insulation film 4*a*, and the second interlayer insulation film 5*a*, the irregularity-forming thin-films 3*g*, 4*g*, 6*g*, and 5*g*, which are each composed of the same layer as that forming the corresponding film, can be patterned to form optional patterns. Consequently, these irregularity-forming thin-films 3*g*, 4*g*, 6*g*, and 5*g* can be formed without adding any steps including a photolithographic step.

In addition, regardless whether the irregular pattern 8*a* is formed on the light reflector 8*a*, the underlying insulation film 11*a* and the gate insulation film 2*a* are formed. Accordingly, the irregularity-forming thin-films 11*g* and 2*g* are formed by selectively leaving insulation films which are composed of the same layers as those forming the insulation films mentioned above; however, it is not necessary to increase the number of film-forming steps.

Furthermore, in this embodiment, since the irregular pattern 8*g* (irregularity-forming thin-films 11*g*, 2*g*, 3*g*, 4*g*, 6*g*, and 5*g*) can be easily formed in the area at which the TFT 30 is not formed, the TFT 30 can be formed by microfabrication without any problems.

In addition, in an area which is under the light reflector 8*a* and is above the irregularity-forming thin-film 6*g*, a planarizing film 7 is formed by using a material having fluidity, and by this planarizing film 7, the steps and the irregularity caused by the presence of the irregularity-forming thin-films 11*g*, 2*g*, 3*g*, 4*g*, 6*g*, and 5*g* are properly reduced, thereby forming an irregular pattern 8*g* having a smooth shape with no edges. Accordingly, the generation of the viewing angle dependence caused by edges can be prevented. In addition, when the thickness of the planarizing film 7 is more than twice the height difference H of the irregular pattern 8*g*, the irregularity is eliminated by the planarizing film 7, and the regular reflection component becomes too strong. As a result, even though a bright image can be obtained, the viewing angle dependence of an image is generated. On the other hand, when the thickness of the planarizing film 7 is less than one-half the height difference H of the irregular pattern 8*g*, the edges cannot reliably be eliminated by the planarizing film 7, and the viewing angle dependence caused by the edges is generated. However, according to this embodiment, the thickness of the planarizing film 7 is set in the range of from one-half to twice the height difference H of the irregular pattern 8*g*, and hence, in addition to the reduction in viewing angle dependence, the brightness of the image can be ensured.

Furthermore, since at least two irregularity-forming thin-films are formed, even when an irregular pattern 8*a* having a sufficient height difference H is formed on the surface of the light reflector 8*a*, it is not necessary to form a thick film which is not suitable for forming the TFT 30.

In addition to the above, concerning the irregularity-forming thin-films 3*g* and 6*g*, which are the conductive films composed of the same layers as those forming the scanning line 3*a* and data line 6*a*, respectively, the irregularity-forming thin-film 6*g* located at the upper layer side is formed inside the region of the irregularity-forming thin-film 3*g* located at the lower layer side and is not extended past the region mentioned above. Furthermore, concerning the four irregularity-forming thin-films 11*g*, 2*g*, 4*g*, and 5*g*, which are the insulation films composed of the same layers forming the lower protection layer 11*a*, the gate insulation film 2*a*, the first interlayer insulation film 4*a*, and the second interlayer insulation film 5*a*, respectively, the irregularity-forming thin-film located at the upper layer side is formed inside the region of the irregularity-forming thin-film located at the lower layer side and is not extended past the region mentioned above.

Accordingly, the individual irregularity-forming thin-films constituting the irregular pattern 8*g* form a forward-tapered structure, that is, they do not form an overhand shape (inversely-tapered shape), and hence, film peeling or film remaining caused by the overhand shape does not occur. In addition, the two irregularity-forming thin-films 3*g* and 6*g* formed of the conductive films, which are left behind and composed of the same layers as those forming the scanning line 3*a* and the data line 6*a*, respectively, are not overlaid on the aperture portion in plan view which is formed by etching the insulating films constituting the underlying protection film 11*a*, the gate insulation film 2*a*, the first interlayer insulation film 4*a*, and the second interlayer insulation film 5*a*. Accordingly, the steps and the irregularity formed by the irregularity-forming thin-films located at the lower layer side are not eliminated by the irregularity-forming thin-films located at the upper layer side, and hence, the irregular pattern 8*g* having a sufficient height difference H can be formed on the light reflector 8*a*.

In addition, since the structure is formed in which the irregularity-forming thin-film 3*g* that is the conductive film composed of the same layer as that forming the scanning line 3a is electrically separated from the scanning line 3a, and the irregularity-forming thin-film 6g that is the conductive film composed of the same layer as that forming the data line 6a is electrically separated from the data line 6a, the scanning line 3a and the data line 6a are not short-circuited to other constituent elements via the irregularity-forming thin-films 3g and 6g, and the capacitance of the irregularity-forming thin-films 3g and 6g are not added to those of the scanning line 3a and the data line 6a.

In this embodiment, as the conductive film for forming the scanning line 3a and the data line 6a, an aluminum film, a tantalum film, a molybdenum film, or an alloy film primarily composed of the metal mentioned above is used, and since these conductive films mentioned above can be formed at a relatively high growth rate and can be patterned into a preferable shape by dry etching, the irregularity-forming thin-films 3g and 6g can be efficiently and preferably formed.

In this embodiment, a silicon oxide film can be used as an insulation films for forming the underlying protection film 11a and the first interlayer insulation film 4a, and since this silicon oxide film can be formed at a relatively high growth rate and can be patterned by dry etching into a preferable shape, the irregularity-forming thin-films 11g and 4g can be efficiently and preferably formed.

In this embodiment, since the irregular pattern 8g has no regions in which neighboring convex portions 8b are repeated at a lateral distance L of 20 µm or less, the generation of interference color can be prevented. In other words, in the irregular pattern 8g, when there are regions in which neighboring convex portions 8b are repeated at a lateral distance L of 20 µm or less, the interference color is generated by the relationship with the light wavelength, however, when there are no such regions, the generation of interference color can be prevented.

In this embodiment, since the height difference H of the irregular pattern 8g is set to 500 nm or more, and is further set to 800 nm or more, the case in which an image is colored by the generation of the frequency dependency of the scattering properties in the visible region due to too small height difference H of the irregular pattern 8g can be prevented.

In addition, all irregularity-forming thin-films 11g, 2g, 3g, 4g, 6g, and 5g are formed to have planar shapes provided with no acute angles at the peripheries thereof, the generation of the frequency dependency of the scattering properties can be prevented, and in addition, the generation of the viewing angle dependence of an image can also be prevented.

Furthermore, since the irregularity-forming thin-films 11g, 2g, 3g, 4g, 6g, and 5g and the open portion at the lower layer side are formed so that each flat portion with an inclination angle α of 3° or less has a planar dimension of 10 µm or less, each flat portion with an inclination angle α of 3° or less of the convex portion 8b and the concave portion 8c, forming the irregular pattern 8g, has a planar dimension of 10 µm or less. Accordingly, the generation of the frequency dependency of the scattering properties can be prevented, and the generation of the viewing angle dependence of an image can also be prevented.

Furthermore, since, in the irregular pattern 8g, the lateral distance L between the neighboring convex portions 8b is in the range of from 5 to 20 times the height difference H of the irregular pattern 8g, the viewing angle dependence and the brightness of an image both in a preferable level can be obtained. That is, when the lateral distance L between the neighboring convex portions 8b is more than 20 times the height difference H of the irregular pattern 8g, the regular reflection component becomes too strong, and even though a bright image can be obtained, the viewing angle dependence of the image is generated. In contrast, when the lateral distance L between the neighboring convex portions 8b is less than 5 times the height difference H of the irregular pattern 8g, the viewing angle dependence is generated. Accordingly, in this embodiment, since the lateral distance L between the neighboring convex portions 8b is set in the range of from 5 to 20 times the height difference H of the irregular pattern 8g, the viewing angle dependence can be reduced, and in addition, the brightness of an image can also be ensured.

In addition, in this embodiment, since the irregularity-forming thin-films 11g, 2g, 3g, 4g, 6g, and 5g are formed so as to have the variation in inclination angle β of 10° or less, or 5° or less, the variation in inclination angle β of the side surfaces of the convex portions 8b forming the irregular pattern 8g is also 10° or less, or 5° or less in one plane. As a result, the generation of brightness irregularity caused by the variation in inclination angle β can be prevented.

A method for manufacturing the TFT 30 having the structure as described above will be described with reference to FIGS. 7 to 10. FIGS. 7, 8, 9, and 10 are cross-sectional views showing steps of the method for manufacturing a TFT array substrate 11 of this embodiment, and all the views correspond to the cross-sectional view taken along the line A-A' in FIG. 4.

First, as shown in FIG. 7(A), after a substrate 10' which is composed of a glass or the like and is cleaned by ultrasonic cleaning or the like is prepared, under the temperature condition of a substrate temperature of 150 to 450° C., over the entire surface of the substrate 10', an insulation film 11 composed of a silicon oxide film 300 to 500 nm thick is formed by a plasma CVD method for forming the underlying protection film 11a. As a source gas used in this step described above, for example, a mixture of monosilane and nitrogen monoxide, a mixture of TEOS and oxygen, or a mixture of disilane and ammonia may be used.

Next, under the temperature condition of a substrate temperature of 150 to 450° C., over the entire surface of the substrate 10', a semiconductor film 1 composed of an amorphous silicon film 50 to 100 nm thick is formed by a plasma CVD method. In this step, as a source gas, for example, disilane or monosilane may be used. Next, laser annealing is performed by irradiating the semiconductor film 1 with laser light. As a result, the amorphous semiconductor film 1 is first melted and is then solidified through the cooling and solidification process. In the step described above, since the time for irradiating each region with the laser light is very short, and the areas irradiated are parts of the entire substrate, the entire substrate is not simultaneously heated to a high temperature. Accordingly, even when a glass substrate is used as the substrate 10', deformation, cracking, or the like is not generated by heat.

Next, a resist mask 551 can be formed on the surface of the semiconductor film 1 using a photolithographic method, and by etching the semiconductor film 1 using this resist mask 551, as shown in FIG. 7(B), an island-shaped semiconductor film 1a (active layer) is formed.

Next, under a temperature condition of 350° or less, over the entire surface of the substrate 10', an insulation film 2 composed of a silicon oxide film 50 to 150 nm thick is formed by a CVD method or the like for forming the gate insulation film 2a and the like on the surface of the semiconductor film 1a. As a source gas used in this step, for example, a mixture of TEOS and an oxygen gas may be used. The insulation film 2 formed in this step may be a silicon nitride film in place of a silicon oxide film.

Next, although not shown in the figure, impurity ions are implanted in the extended portion if of the semiconductor film 1a by using a predetermined resist mask, thereby forming a lower electrode for forming a storage capacitor 60 between the capacitive line 3b and the extended portion if.

Next, as shown in FIG. 7(C), by a sputtering method or the like, over the entire surface of the substrate 10', a conductive film 3 composed of an aluminum film, a tantalum film, a molybdenum film, or an alloy film primarily composed of the metal mentioned above having a thickness of 300 to 800 nm is formed to form a scanning line 3a, and a resist mask 552 is then formed by using a photolithographic technique.

Next, the conductive film 3 is dry-etched by using the resist mask 552, and as shown in FIG. 7(D), the scanning line 3a (gate electrode) and the capacitive lines 3b are formed. In the step described above, in an area at which the TFT 30 is not formed, the irregularity-forming thin-film 3g that is the conductive film composed of the same layer as that forming the scanning line 3a is left behind. In the step described above, the irregularity-forming thin-film 3g is formed so as to be electrically separated from the scanning line 3a.

Next, at the sides of a pixel TFT portion and an N channel TFT portion (not shown) of a drive circuit, a lightly doped source region 1b and a lightly doped drain region 1c are formed in a self alignment manner with respect to the scanning line 3a by implanting low-concentrated impurity ions (phosphorus ions) at a dose of approximately $0.1 \times 10^{13}/cm^2$ to $10 \times 10^{13}/cm^2$ using the scanning line 3a and the gate electrode as a mask. In the step described above, an area in which the impurity ion is not implanted, being located under the scanning line 3a is used as a channel region 1a' which is formed of the semiconductor film 1a itself.

Next, as shown in FIG. 7(E), in the pixel TFT portion, a resist mask 553 having a width larger that that of the scanning line 3a (gate electrode) is formed, and a highly doped source region 1d and doped drain region 1e are then formed by implanting high-concentrated impurity ions (phosphorus ions) at a dose of approximately $0.1 \times 10^{15}/cm^2$ to $10 \times 10^{15}/cm^2$.

In place of these steps of implanting impurities, without implanting a low-concentrated impurity, implantation of a high-concentrated impurity (phosphorous ions) may be performed under the condition in which a resist mask having a width larger than that of the gate electrode is formed so as to form the source region and the drain region of the offset structure. In addition, a high-concentrated impurity may naturally be implanted using the scanning line 3a as a mask so as to form the source region and the drain region of the self align structure.

The N channel TFT portion of a peripheral drive circuit is formed as described above, and in the step described above, although not shown in the figure, a P channel TFT portion is covered with a mask. In addition, when the P channel TFT portion of the peripheral drive circuit is formed, the pixel portion and the N channel TFT portion are covered with a resist for protection, and the P channel source and drain regions are then formed in a self alignment manner by implanting boron ions at a dose of approximately $0.1 \times 10^{15}/cm^2$ to $10 \times 10^{15}/cm^2$. In the step described above, as in the case of the formation of the N channel TFT portion, a lightly doped region is formed in a polysilicon film by implanting a low-concentrated impurity (boron ions) at a dose of approximately $0.1 \times 10^{13}/cm^2$ to $10 \times 10^{13}/cm^2$ using the gate electrode as a mask, and subsequently, the source region and the drain region of an LDD structure (lightly doped drain structure) may be formed by implanting a high-concentrated impurity (boron ions) at a dose of approximately $0.1 \times 10^{15}/cm^2$ to $10 \times 10^{15}/cm^2$ using a mask which is formed beforehand so as to have a width larger than that of the gate electrode. In addition, without implanting a low-concentrated impurity, implantation of a high-concentrated impurity (phosphorus ions) may be performed under the condition in which a resist mask having a width larger than that of the gate electrode is formed so as to form the source region and the drain region of the offset structure. By these steps of ion implantation, CMOS structures can be formed, and a peripheral drive circuit can be embedded in the same substrate.

Next, as shown in FIG. 7(F), after forming a resist mask 554 by using a photolithographic technique, the insulation films 2 and 11 are dry-etched by using the resist mask 554 so that the irregularity-forming thin-films 2g and 11g, which are the insulation films composed of the same layers as those forming the gate insulation film 2a and the underlying protection film 11a, respectively, are left behind in the area at which the irregularity-forming thin-film 3g is overlaid on the insulation films mentioned above as shown in FIG. 8(A).

Next, as shown in FIG. 8(B), at the surface side of the scanning line 3a, an insulation film 4 composed of a silicon oxide film 300 to 800 nm thick is formed by a CVD method or the like for forming the first interlayer insulation film 4a. As a source gas used in this step, for example, a mixture of TEOS and an oxygen gas may be used.

Next, a resist mask 555 is formed by using a photolithographic technique.

Next, by dry-etching the insulation film 4 using the resist mask 555, and as shown in FIG. 8(C), contact holes corresponding to the source region and the drain region are formed in the first interlayer insulation film 4a. In the step described above, on the region on which the irregularity-forming thin-film 3g is overlaid, the irregularity-forming thin-films 4g, which is the insulation film composed of the same layer as that forming the first interlayer insulation film 4a, are left behind.

Next, as shown in FIG. 8(D), at the surface side of the first interlayer insulation film 4a, a conductive film 6 composed of an aluminum film, a tantalum film, a molybdenum film, or an alloy film primarily composed of the metal mentioned above having a thickness of 300 to 800 nm is formed by a sputtering method or the like for forming the data line 6a (source electrode) and the like, and subsequently, a resist mask 556 is formed by a photolithographic technique.

Next, by dry-etching the conductive film 6 using the resist mask 556, and as shown in FIG. 8(E), the data line 6a and the drain electrode 6b are formed. In the step described above, on the regions on which the irregularity-forming thin-films 4g are overlaid, the irregularity-forming thin-films 6g formed of the insulation film of the same layer as that forming the data line 6a are left behind. These irregularity-forming thin-films 6g are formed so as to be electrically separated from the data line 6a.

Next, as shown in FIG. 9(A), at the surface sides of the data line 6a and the drain electrode 6b, an insulation film 5 composed of a silicon nitride film having a thickness of 100 to 300 nm is formed by a CVD method or the like for forming the second interlayer insulation film 5a, and subsequently, a resist mask 557 for forming a contact hole and the like in the second interlayer insulation film 5a is formed by a photolithographic technique.

Next, by dry-etching the insulation film 5 using the resist mask 557, and as shown in FIG. 9(B), a contact hole is formed in a part of the second interlayer insulation film 5a corresponding to the drain electrode 14. In the step described above, on the regions on which the irregularity-forming thin-films 6g are overlaid, the irregularity-forming thin-films 5g formed of the insulation film of the same layer as that forming the second interlayer insulation film 5a, are left behind.

Next, as shown in FIG. 9(C), to the surface sides of the second interlayer insulation film 5a and the irregularity-forming thin-films 5g, perhydropolysilazane or a composition containing the same is applied and is then fired, or an acrylic resin is applied, so that a planarizing film 7 is formed.

In the step described above, since the planarizing film 7 is formed by applying a material having fluidity, the steps and the irregularity caused by the presence of the irregularity-forming thin-films 11g, 2g, 3g, 4g, 6g, and 5g are properly eliminated, and hence, an irregular pattern having a smooth shape with no edges is formed on the surface of the planarizing film 7. However, when the planarizing film 7 is too thick, the irregularity is eliminated by the planarizing film 7, and in contrast, when the planarizing film 7 is too thin, the edges cannot be reliably eliminated. Accordingly, the thickness of the planarizing film 7 is set in the range of from approximately one-half to twice the total thickness of the irregularity-forming thin-films 11g, 2g, 3g, 4g, 6g, and 5g.

In this connection, perhydropolysilazane is one type of inorganic polysilazane and is a coating type material which is converted into a silicon oxide film by firing in the air. For example, polysilazane manufactured by Tonen Corp. is an inorganic polymer having a repeating unit represented by —($SiH_2NH$)— and is soluble in an organic solvent such as xylene. Accordingly, when an organic solvent solution (for example, a xylene solution at a concentration of 20%) of this inorganic polymer is applied by a spin coating method (for example, at 2,000 rpm for 20 seconds) and is then fired at 450° C. in the air, the material is reacted with moisture and oxygen, a dense amorphous silicon oxide film equivalent or superior to a silicon oxide film formed by a CVD method can be obtained.

Next, by using a photolithographic technique, after a resist mask 558 for forming a contact hole in the planarizing film 7 is formed, the planarizing film 7 is etched by using the resist mask 558 so as to form the contact hole as shown in FIG. 9(D). When a photosensitive material is used for the planarizing film 7, after being applied and prebaked, the material is directly exposed using a photolithographic method, is developed, and is then postbaked, so that the same contact hole as that described above can be obtained.

As shown in FIG. 10(A), after a metal film 8, such as an aluminum film, having reflectivity is formed on the surface of the planarizing film 7 by a sputtering method or the like, a resist mask 559 is formed by a photolithographic technique.

Next, by etching the metal film 8 using the resist mask 559, and as shown in FIG. 10(B), the light reflector 8a is left behind in a predetermined region. On the surface of the light reflector 8a thus formed, the irregular pattern 8g having an height difference of 500 nm or more, or 800 nm or more, is formed by the steps and the irregularity formed by the irregularity-forming thin-films 11g, 2g, 3g, 4g, 6g, and 5g and the non-formation regions at which the irregularity-forming thin-films are not formed, and in addition, this irregular pattern 8g is formed to have a smooth shape with nor edges by the planarizing film 7.

As shown in FIG. 10(C), on the surface side of the light reflector 8a, an ITO film 9 having a thickness of 40 to 200 nm is formed by a sputtering method or the like, and a resist mask 560 is formed by using a photolithographic technique.

Next, by etching the ITO film 9 using the resist mask 560, and as shown in FIG. 10(D), the pixel electrode 9a that is connected to the drain electrode 6b is formed.

After the steps described above are performed, as shown in FIGS. 5 and 6, on the surface side of the pixel electrode 9a, a polyimide film (alignment film 12) is formed. In order to form the polyimide film, after a polyimide varnish, composed of 5 to 10 wt % of polyimide or a polyamic acid dissolved in a solvent, such as butyl cellusolve, n-methyl pyrrolidone, or the like, is applied by flexographic printing, heating and curing (firing) are performed. Subsequently, the substrate provided with the polyimide film is rubbed in a predetermined direction by a puff formed of rayon fabrics, so that the polyimide molecules are aligned in the vicinity of the surface in a predetermined direction. As a result, by the interaction between liquid crystal molecules which are subsequently enclosed in a device and the polyimide molecules, the liquid crystal molecules are aligned in a predetermined direction.

As described above, the TFT array substrate 10 can be formed. In this connection, the irregularity-forming thin-films 11g, 2g, 3g, 4g, 6g, and 5g are preferably formed so as to have a planar shape with no edges at the periphery thereof, and this structure described above can be realized by setting one side length of an aperture to the vicinity of the maximum resolution of an exposure machine by using CAD when an exposure mask is designed. In addition, since the variation in inclination angle of side surfaces of the individual convex portions 8b for forming the irregular pattern 8g is preferably 10° or less and is more preferably 5° or less, when RIE etching or high density plasma etching is performed among various dry etching methods in order to form the irregularity-forming thin-films, the variation in inclination angle of the side surfaces of the convex portions 8b can be significantly reduced.

FIGS. 11(A), (B) are cross-sectional views showing particular steps of a manufacturing method for a TFT array substrate of an electro-optical device of a second embodiment according to the present invention. FIG. 12 is an enlarged cross-sectional view showing the irregular pattern, formed on the light reflector in an area at which the TFT for pixel switching is not formed, of the electro-optical device of the second embodiment according to the present invention. Since this embodiment and other embodiments described later each basically have the same structure as that of the first embodiment, the same reference numerals designate the same constituent elements in FIGS. 11 and 12, and descriptions thereof are omitted.

In the first embodiment, as shown in FIGS. 7(F) and 8(A), after the irregularity-forming thin-films 2g and 11g are left behind by etching the insulation films 2 and 11, and as shown in FIGS. 8(B) and (C), the irregularity-forming thin-films 4g are left behind by etching the insulation film 4. However, in this embodiment, as shown in FIG. 11(A), the insulation films 2 and 11 are not etched until the insulation film 4 is formed, and when the insulation film 4 is etched by using the resist mask 555, as shown in FIG. 11(B), the insulation films 2 and 11 are simultaneously etched, so that the irregularity-forming thin-films 11g, 2g, and 4g are simultaneously formed. Accordingly, in this embodiment, one photolithographic step can be eliminated compared to the case of the first embodiment.

When the manufacturing method described above is used, as shown in FIG. 12, by the steps and the irregularity formed by the irregularity-forming thin-films 11g, 2g, 3g, 4g, 6g, and 5g and the non-formation regions, the irregular pattern 8g can also be formed on the surface of the light reflector 8a.

FIGS. 13(A), (B) are cross-sectional views showing particular steps of a manufacturing method for a TFT array substrate of an electro-optical device of a third embodiment according to the present invention. FIG. 14 is an enlarged cross-sectional view showing the irregular pattern, formed on the light reflector in an area at which the TFT for pixel switching is not formed, of the electro-optical device of the third embodiment according to the present invention.

In the second embodiment, as described with reference to FIGS. 11(A) and (B), the insulation films 2, 4, and 11 are simultaneously etched, so that the irregularity-forming thin-films 11g, 2g and 4g are simultaneously formed. However, in this embodiment, as shown in FIG. 13(A), semiconductor films 1a' composed of the same layer as that forming the semiconductor film 1a of the TFT 30 are left behind in areas corresponding to the concave portions 8c of the irregular pattern 8g formed on the light reflector 8a, and in the state described above, the irregularity-forming thin-films 4g are formed by dry-etching of the insulation film 4 as shown in FIG. 13(B).

When the structure is formed as described above, as shown in FIG. 14, since the semiconductor film 1a'' serves as an etching stopper, and the insulation film 11 forming the underlying protection film 11a is not etched, the underlying protection film 11 can be left behind over the entire surface of the TFT array substrate 10.

In addition, in this embodiment, by the steps and the irregularity formed by the irregularity-forming thin-films 3g, 4g, 6g, and 5g and the non-formation regions thereof, the irregular pattern 8g can be formed on the surface of the light reflector 8a.

FIG. 15 is an enlarged cross-sectional view showing the irregular pattern, formed on the light reflector in an area at which the TFT for pixel switching is not formed, of an electro-optical device of a fourth embodiment according to the present invention.

In the first embodiment, as shown in FIG. 6, since the individual irregularity-forming thin-films 11g, 2g, 3g, 4g, 6g, and 5g are formed so that the centers thereof coincide with each other, the side surfaces of each convex portion 8b forming the irregular pattern 8g provided on the surface of the light reflector 8a are symmetrical with respect to the center of the convex portion 8b, and the reflection light is isotropic. However, in this embodiment, as shown in FIG. 15, the irregularity-forming thin-films 11g, 2g, 3g, 4g, and 5g are formed so that the centers thereof coincide with each other, and the irregularity-forming thin-film 6g is formed so that the center thereof is shifted from the centers of the irregularity-forming thin-films 11g, 2g, 3g, 4g, and 5g to the side in the distinct viewing direction. Accordingly, the centers of the protruding patterns formed of the conductive films which are left behind and the centers of the recessed patterns which are openings formed in the insulation films are asymmetrical in plan view.

When the structure is formed as described above, in the irregular pattern 8g formed on the surface of the light reflector 8a, the slopes of the side surfaces of each convex portion 8b are asymmetrical with respect to the center thereof, and reflected light has anisotropic properties to some extent. Accordingly, by using these anisotropic properties, the display quality can be improved. That is, in the example shown in FIG. 15, since, in each convex portion 8b forming the irregular pattern 8g, the side surface having a steeper slope faces the side in the distinct viewing direction, the scattering component in the distinct viewing direction can be enhanced, and hence, the brightness of the entire image can be increased while the brightness in the distinct viewing direction is maintained.

FIG. 16 is an enlarged cross-sectional view showing the irregular pattern, formed on the surface of the light reflector in an area at which the TFT for pixel switching is not formed, of an electro-optical device of a fifth embodiment according to the present invention.

In order to make light reflected from the light reflector 8a have anisotropic properties, as shown in FIG. 16, the irregularity-forming thin-films 11g, 2g, 4g, and 5g may be formed so that the centers thereof coincide with each other, and the centers of the irregularity-forming thin-films 3g and 6g may be shifted from the centers of the irregularity-forming thin-films 11g, 2g, 4g, and 5g to the side in the distinct viewing direction determined by rubbing treatment. When the structure is formed as described above, the centers of the protruding patterns formed of the conductive films which are left behind and the centers of the recessed patterns which are openings formed in the insulation film are asymmetrical in plan view.

When the structure is formed as described above, in the irregular pattern 8g formed on the surface of the light reflector 8a, the slopes of the side surfaces of each convex portion 8b are asymmetrical with respect to the center thereof, and hence, the reflected light has anisotropic properties to some extent. Accordingly, as described in this embodiment, when the steeper slope of the side surfaces of each convex portion 8b, forming the irregular pattern 8g, is formed so as to face the side in the distinct viewing direction, the scattering component in the distinct viewing direction is enhanced, and hence, the brightness of the entire image can be increased while the brightness in the distinct viewing direction is maintained.

FIG. 17 is a cross-sectional view of an electro-optical device of a sixth embodiment according to the present invention.

In the first to the fifth embodiments, the TFT 30 for pixel switching formed in each pixel 100a is a normally-staggered type or a coplanar type polysilicon TFT, however, as shown in FIG. 17, other type TFT, such as an inversely staggered type TFT or an amorphous silicon TFT may also be used for pixel switching.

In the case in which the structure is formed as described above, as shown in FIG. 17, in the TFT array substrate 10, in an area at which the inversely staggered type TFT 30 is not formed, when the irregularity-forming thin-film 3g which is a conductive film composed of the same layer as that forming the scanning line 3a (gate electrode), the irregularity-forming thin-film 2g which is an insulation film composed of the same layer as that forming the gate insulation film 2a, and the irregularity-forming thin-film 6g which is a conductive film composed of the same layer as that forming the data line 6a are selectively formed so as to have predetermined patterns, the irregular pattern 8g can be formed on the surface of the light reflector 8a by the steps and the irregularity formed by these film formation regions and the non-formation regions.

The reflective or the transflective electro-optical devices 100 having the structure described above can be used as a display portion of various electronic apparatuses, and examples thereof will be described with reference to FIGS. 18, 19, and 20.

FIG. 18 is an exemplary block diagram showing the circuit structure of an electronic apparatus using the electro-optical device of the present invention as a display device. In FIG. 18, the electronic apparatus includes a display information output source 70, a display information processing circuit 71, a power supply circuit 72, a timing generator 73, and a liquid crystal device 74. In addition, the liquid crystal device 74 has a liquid crystal display panel 75 and a drive circuit 76. As the liquid crystal device 74, the electro-optical device 100 described above may be used.

The display information output source 70 can include various memories, such as ROM (Read Only Memory) and RAM (Random Access Memory), storage units such as various disks, and a tuning circuit that is tuned to digital image signals and outputs the signals, and the display information output source 70 supplies display information such as an image signal of a predetermined format to the display information processing circuit 71 in accordance with various clock signals generated by the timing generator 73.

The display information processing circuit 71 includes known various circuits, such as a serial-parallel conversion circuit, an amplifier/inversion circuit, a rotation circuit, a gamma correction circuit, and a clamp circuit, executes processing of the input display information, and supplies the image signals to the drive circuit 76 together with the clock signals CLK. The power supply circuit 72 supplies predetermined voltages to various constituent elements.

FIG. 19 shows a mobile type personal computer that is an electronic apparatus of an embodiment according to the present invention. A personal computer 80 shown in the figure can include a main body 82 provided with a keyboard 81 and a liquid crystal display unit 82. The liquid crystal display unit 83 comprises the electro-optical device 100 described above.

FIG. 20 shows a mobile phone that is an electronic apparatus of another embodiment according to the present invention. A mobile phone 90 shown in the figure includes a plurality of operation buttons 91 and a display portion formed of the electro-optical device 100 described above.

As has thus been described, in the present invention, in the area which is at the lower layer side of the light reflector and which is overlaid therewith, an irregularity-forming thin-film is selectively formed by patterning a thin-film so as to have a predetermined pattern, and the thin-film is composed of the same layer as that forming at least one of the wires and insulation films. By using the steps and the irregularity caused by the presence of this irregularity-forming thin-film, the irregular pattern is formed on the surface of the light reflector. In the steps described above, the wires and the insulation films must be formed regardless whether they are used for forming the irregularity on the surface of the light reflector, that is, after predetermined thin-films are formed over the entire surface of the substrate, the wires and the insulation films described above are formed by patterning the thin-films mentioned above using a photolithographic technique. Accordingly, by using the entire steps of forming the wires and the insulation films, the irregularity-forming thin-films, which are composed of the same layers as those forming the wires and the insulation films, can be selectively formed so as to have predetermined patterns. Accordingly, without adding a film-forming step, a light reflector having light diffusion function can be formed. In addition, since the irregularity-forming thin-film can be easily formed in an area at which the active element is not formed, microfabrication for forming the active element can be performed without any problems.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. An electro-optical device comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming the at least one wire, whereby a region is formed an irregular pattern on a surface of the light reflector.

2. The electro-optical device according to claim 1, further comprising:

a planarizing film formed at the lower layer side of the light reflector and at an upper layer side of the irregularity-forming thin-film.

3. The electro-optical device according to claim 1, the active element being at least one of a thin-film transistor and a thin-film diode element, and one of the wires being a scanning line.

4. The electro-optical device according to claim 1, the active element being a thin-film transistor, and one of the wires being a data line.

5. The electro-optical device according to claim 1, the irregularity-forming thin-film at least including an insulation film.

6. The electro-optical device according to claim 5, a number of the least one wire being two or more, and the insulation film including an insulation layer composed of the same layer as that forming an interlayer insulation film for electrically insulating between the wires.

7. The electro-optical device according to claim 5, the insulation film including an insulation layer composed of the same layer as that forming a protection insulation film on the uppermost wire.

8. The electro-optical device according to claim 5, at least one-half of the insulation film in the thickness direction being formed of a silicon oxide film.

9. The electro-optical device according to claim 8, the insulation film being formed by a dry etching method.

10. The electro-optical device according to claim 1, the irregularity-forming thin-film being formed into a planar shape provided with no sharp edges at a periphery thereof.

11. The electro-optical device according to claim 1, the electro-optical material including liquid crystal.

12. An electronic apparatus, comprising
an electro-optical device according to claim 1 as a display device.

13. An electro-optical device, comprising:
substrates;
an electro-optical material provided between the substrates; and
a plurality of pixels on one of the substrates, each pixel including at least one wire, at least one insulation film which is provided on an uppermost wire, under a lowermost wire, or between the wires, a light reflector, and an active element for pixel switching connected to the at least one wire,
in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector,
a planarizing film formed at the lower layer side of the light reflector and at an upper layer side of the irregularity-forming thin-film,
an average thickness of the planarizing film being in the range of one-half to twice a height difference of the irregular pattern.

14. An electro-optical device, comprising:
substrates;
an electro-optical material provided between the substrates; and
a plurality of pixels on one of the substrates, each pixel including at least one wire, at least one insulation film which is provided on an uppermost wire, under a lowermost wire, or between the wires, a light reflector, and an active element for pixel switching connected to the at least one wire,
in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector,
the irregularity-forming thin-film at least including a conductive film composed of the same layer as that forming one of the wires.

15. The electro-optical device according to claim 14, the irregularity-forming thin-film, which includes the conductive film composed of the same layer as that forming the one of the wires, being electrically separated from the wire.

16. The electro-optical device according to claim 14, the thickness of the conductive film being 500 nm or more.

17. The electro-optical device according to claim 14, at least one-half of the conductive film in the thickness direction being formed of at least one of an aluminum film, a tantalum film, a molybdenum film, and an alloy film primarily composed of the above metal.

18. The electro-optical device according to claim 14, the conductive film being processed by a dry etching method.

19. An electro-optical device, comprising:
substrates;
an electro-optical material provided between the substrates; and
a plurality of pixels on one of the substrates, each pixel including at least one wire, at least one insulation film which is provided on an uppermost wire, under a lowermost wire, or between the wires, a light reflector, and an active element for pixel switching connected to the at least one wire,
in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector,
the active element being a thin-film transistor,
the wires including both a scanning line and a data line, and
the irregularity-forming thin-film including conductive films composed of the same layers as those forming the scanning line and the data line, respectively.

20. An electro-optical device, comprising:
substrates;
an electro-optical material provided between the substrates; and
a plurality of pixels on one of the substrates, each pixel including at least one wire, at least one insulation film which is provided on an uppermost wire, under a lowermost wire, or between the wires, a light reflector, and an active element for pixel switching connected to the at least one wire,
in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector,
the irregularity-forming thin-film at least including an insulation film,
the insulation film including an insulation layer which is composed of the same layer as that forming an underlying protection film under the active element and the at least one wire.

21. An electro-optical device, comprising:
substrates;
an electro-optical material provided between the substrates; and
a plurality of pixels on one of the substrates, each pixel including at least one wire, at least one insulation film which is provided on an uppermost wire, under a lowermost wire, or between the wires, a light reflector, and an active element for pixel switching connected to the at least one wire,
in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, the irregularity-forming thin-film at least including an insulation film, a number of the least one wire being two or more, and the insulation film including an insulation layer composed of the same layer as that forming an interlayer insulation film for electrically insulating between the wires, the active element being a thin-film transistor, and a semiconductor film composed of the same layer as that forming an active layer of the thin-film transistor being provided under the irregularity-forming thin-film and being overlaid therewith in plan view.

22. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, the irregular pattern having no area in which neighboring convex portions thereof are repeated at a lateral distance of 20 μm or less.

23. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, a height difference of the irregular pattern being 500 nm or more.

24. The electro-optical device according to claim 23, the height difference of the irregular pattern being 800 nm or more.

25. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, the irregularity-forming thin-film being formed into a planar shaped provided with no sharp edges at a periphery thereof, the irregularity-forming thin-film being formed by using a mask in a polygonal shape having a length which is not more than twice the resolution of a photolithographic machine in use.

26. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, convex portions and concave portions, which form the irregular pattern, each having a flat portion, and the flat portion with an inclination angle of 3° or less with respect to the substrate having a planar dimension of 10 μm or less.

27. The electro-optical device according to claim 26, the lateral distance between the neighboring convex portions of the irregular pattern being in the range of five to twenty times a height difference thereof.

28. The electro-optical device according to claim 26, the variation in inclination angle of side surfaces of the convex portions, which form the irregular pattern, being 10° or less in one plane.

29. The electro-optical device according to claim 28, the variation in inclination angle of the side surfaces of the convex portions, which form the irregular pattern, being 5° or less in one plane.

30. The electro-optical device according to claim 26, slopes of side surfaces of each convex portion forming the irregular pattern being asymmetrical with respect to the center of the corresponding convex portion.

31. The electro-optical device according to claim 30, side surface having a steeper slope of each convex portion, which forms the irregular pattern, faces a side in a distinct viewing direction.

32. The electro-optical device according to claim 30, the irregularity-forming thin-film at least comprising a plurality of conductive films, protruding patterns formed of the conductive films which are left behind overlapping each other in plan view, and an asymmetrical pattern in which the overlap center and the centers of the individual protruding patterns do not coincide with each other being formed.

33. The electro-optical device according to claim 30, the irregularity-forming thin-film at least comprising a plurality of insulation films, recessed patterns which are openings formed in the plurality of insulation films overlapping each other in plan view, and an asymmetrical pattern in which overlap center and centers of the individual recessed patterns do not coincide with each other being formed.

34. The electro-optical device according to claim 30, the irregularity-forming thin-film including at least one insulation film and at least one conductive film, and centers of protruding patterns formed of the conductive films which are left behind and centers of recessed patterns which are openings formed in the insulation films being asymmetrical in plan view.

35. The electro-optical device according to claim 26, a remaining pattern at the lower layer side of the convex portion, which forms the irregular pattern, being formed outside a remaining pattern at the upper layer side of the convex portion, and an aperture pattern at the lower layer side of the concave portion, which forms the irregular pattern, being formed inside an aperture pattern at the upper layer side of the concave portion, so that the irregularity-forming thin-film has a forward-tapered shape.

36. The electro-optical device according to claim 35, the irregularity-forming thin-film including a plurality of conductive films, and a protruding pattern formed of the conductive film which is left behind at the upper side being formed inside the region at which a protruding pattern formed of the conductive film which is left behind at the lower side is formed.

37. The electro-optical device according to claim 35, the irregularity-forming thin-film including a plurality of insulation films, and a recessed pattern which is an opening provided in the insulation film at the lower side being formed inside the region at which a recessed pattern which is an opening provided in the insulation film at the upper side is formed.

38. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, the irregularity-forming thin-film comprising at least one insulation film and at least one conductive film, and a protruding pattern formed of the conductive film which is left behind and a recessed pattern which is an opening provided in the insulation film having no portions overlapping each other in plan view.

39. An electro-optical device, comprising:

substrates;

an electro-optical material provided between the substrates; and a plurality of pixels on one of the substrates, each pixel including at least one wire, at least one insulation film which is provided on an uppermost wire, under a lowermost wire, or between the wires, a light reflector, and an active element for pixel switching connected to the at least one wire, in an area which is at a lower layer side of the light reflector and which is overlaid therewith in plan view, an irregularity-forming thin-film being selectively formed by patterning a thin-film so as to have a predetermined pattern, the thin-film being composed of the same layer as that forming at least one of the at least one wire and the at least one insulation film, whereby a region is formed an irregular pattern on a surface of the light reflector, the irregularity-forming thin-film including a plurality of insulation films or a plurality of conductive films, and the thickness of each insulation film or each conductive film being 800 nm or less.

* * * * *